(12) United States Patent
Chang et al.

(10) Patent No.: US 11,018,022 B2
(45) Date of Patent: May 25, 2021

(54) METHOD FOR FORMING SEMICONDUCTOR DEVICE STRUCTURE HAVING OXIDE LAYER

(71) Applicant: Taiwan Semiconductor Manufacturing Co., Ltd., Hsinchu (TW)

(72) Inventors: I-Ming Chang, ShinChu (TW); Chih-Cheng Lin, Taipei (TW); Chi-Ying Wu, Hsinchu (TW); Wei-Ming You, Taipei (TW); Ziwei Fang, Hsinchu (TW); Huang-Lin Chao, Oregon, OR (US)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 152 days.

(21) Appl. No.: 16/035,159

(22) Filed: Jul. 13, 2018

(65) Prior Publication Data
US 2020/0020544 A1    Jan. 16, 2020

(51) Int. Cl.
| | |
|---|---|
| H01L 21/335 | (2006.01) |
| H01L 21/8232 | (2006.01) |
| H01L 21/425 | (2006.01) |
| H01L 21/322 | (2006.01) |
| H01L 21/28 | (2006.01) |
| H01L 29/78 | (2006.01) |
| H01L 21/762 | (2006.01) |
| H01L 29/165 | (2006.01) |
| H01L 29/66 | (2006.01) |

(52) U.S. Cl.
CPC .... *H01L 21/3221* (2013.01); *H01L 21/28176* (2013.01); *H01L 21/28185* (2013.01); *H01L 21/28202* (2013.01); *H01L 21/76224* (2013.01); *H01L 29/165* (2013.01); *H01L 29/66795* (2013.01); *H01L 29/7848* (2013.01); *H01L 29/7851* (2013.01)

(58) Field of Classification Search
CPC ......... H01L 21/28176; H01L 21/28185; H01L 21/28202; H01L 21/76224; H01L 29/165; H01L 29/66795; H01L 29/7848; H01L 29/7851; H01L 21/3225; H01L 21/0415; H01L 21/046; H01L 21/2253; H01L 21/265; H01L 21/31155; H01L 21/425; H01L 21/76859; H01L 23/26; H01L 27/14698; H01L 31/186; H01L 29/0615; H01L 29/36
USPC .................. 438/143, 514; 257/611
See application file for complete search history.

(56) References Cited

U.S. PATENT DOCUMENTS

| | | | | |
|---|---|---|---|---|
| 2002/0063295 | A1* | 5/2002 | Ando | H01L 21/823857 257/369 |
| 2017/0373058 | A1* | 12/2017 | Tsau | H01L 29/66545 |
| 2018/0182768 | A1* | 6/2018 | Mihara | H01L 29/4933 |

* cited by examiner

*Primary Examiner* — Duy T Nguyen
*Assistant Examiner* — Dilinh P Nguyen
(74) *Attorney, Agent, or Firm* — Birch, Stewart, Kolasch & Birch, LLP

(57) ABSTRACT

A method for forming a semiconductor device structure is provided. The method includes depositing a gate dielectric layer over a substrate. The substrate has a base portion and a first fin portion over the base portion, and the gate dielectric layer is over the first fin portion. The method includes forming a gate electrode layer over the gate dielectric layer. The gate electrode layer includes fluorine. The method includes annealing the gate electrode layer and the gate dielectric layer so that fluorine from the gate electrode layer diffuses into the gate dielectric layer.

20 Claims, 34 Drawing Sheets

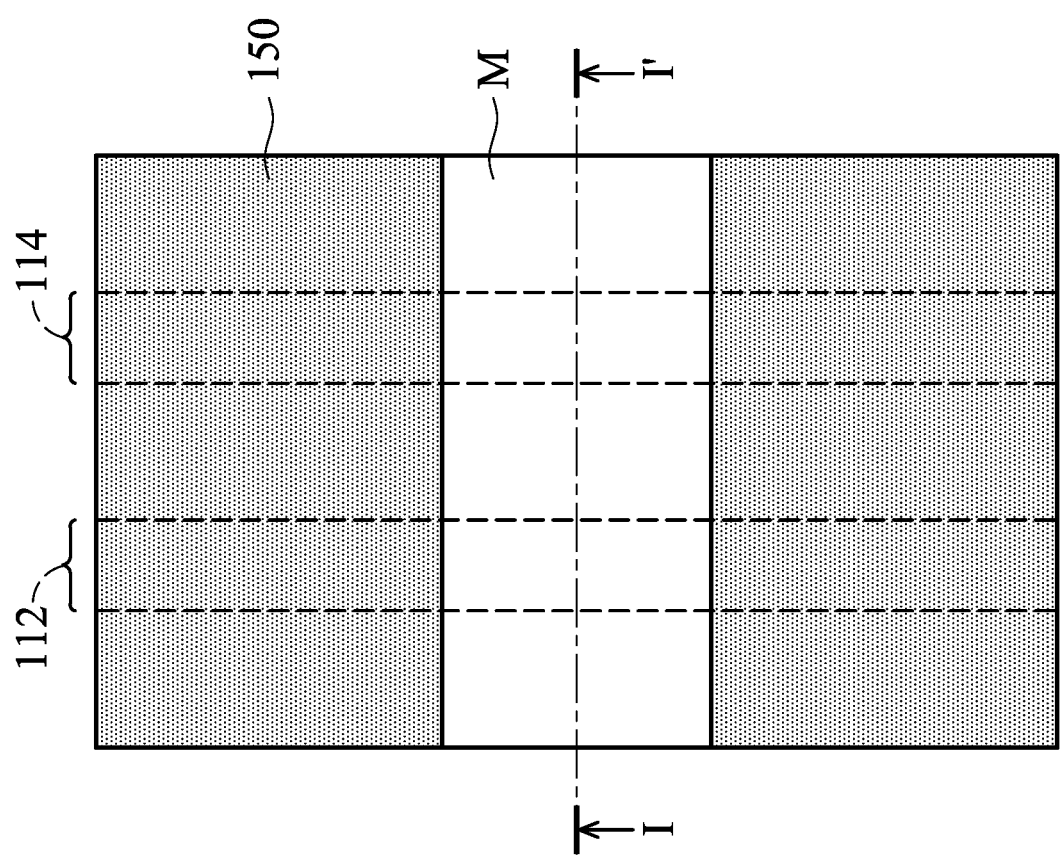

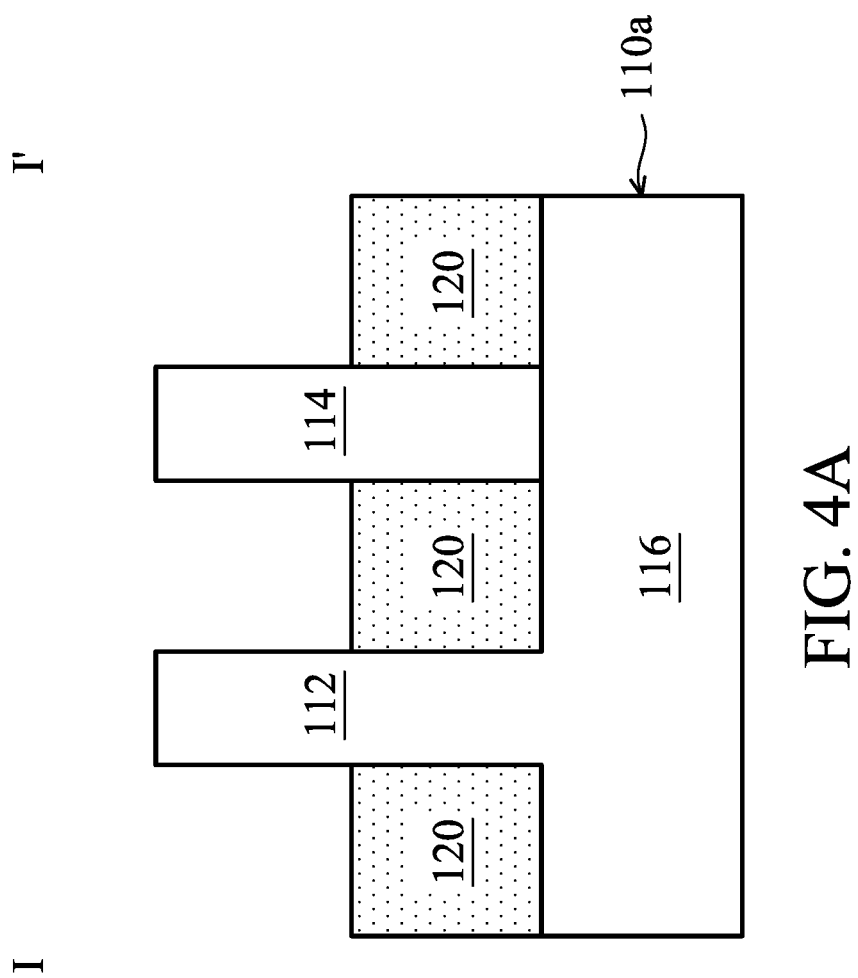

METHOD FOR FORMING SEMICONDUCTOR DEVICE STRUCTURE HAVING OXIDE LAYER

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, since feature sizes (e.g., a distance between fin portions of a fin field effect transistor) continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

FIG. 1A-1 is a top view of the semiconductor device structure of FIG. 1A, in accordance with some embodiments.

FIG. 1A-2 is a perspective view of the semiconductor device structure of FIG. 1A, in accordance with some embodiments.

FIG. 1E-1 is a top view of the semiconductor device structure of FIG. 1E, in accordance with some embodiments.

FIG. 1F-1 is a top view of the semiconductor device structure of FIG. 1F, in accordance with some embodiments.

FIG. 1F-2 is a perspective view of the semiconductor device structure of FIG. 1F, in accordance with some embodiments.

FIGS. 4A-4B are cross-sectional views of various stages of a process for forming a semiconductor device structure, in accordance with some embodiments.

FIG. 4A-1 is a top view of the semiconductor device structure of FIG. 4A, in accordance with some embodiments.

FIG. 4A-2 is a perspective view of the semiconductor device structure of FIG. 4A, in accordance with some embodiments.

FIG. 4B-1 is a top view of the semiconductor device structure of FIG. 4B, in accordance with some embodiments.

FIG. 4B-2 is a perspective view of the semiconductor device structure of FIG. 4B, in accordance with some embodiments.

FIG. 6E-1 is a top view of the semiconductor device structure of FIG. 6E, in accordance with some embodiments.

FIG. 6F-1 is a top view of the semiconductor device structure of FIG. 6F, in accordance with some embodiments.

FIG. 6F-2 is a perspective view of the semiconductor device structure of FIG. 6F, in accordance with some embodiments.

DETAILED DESCRIPTION

Figure 1A:
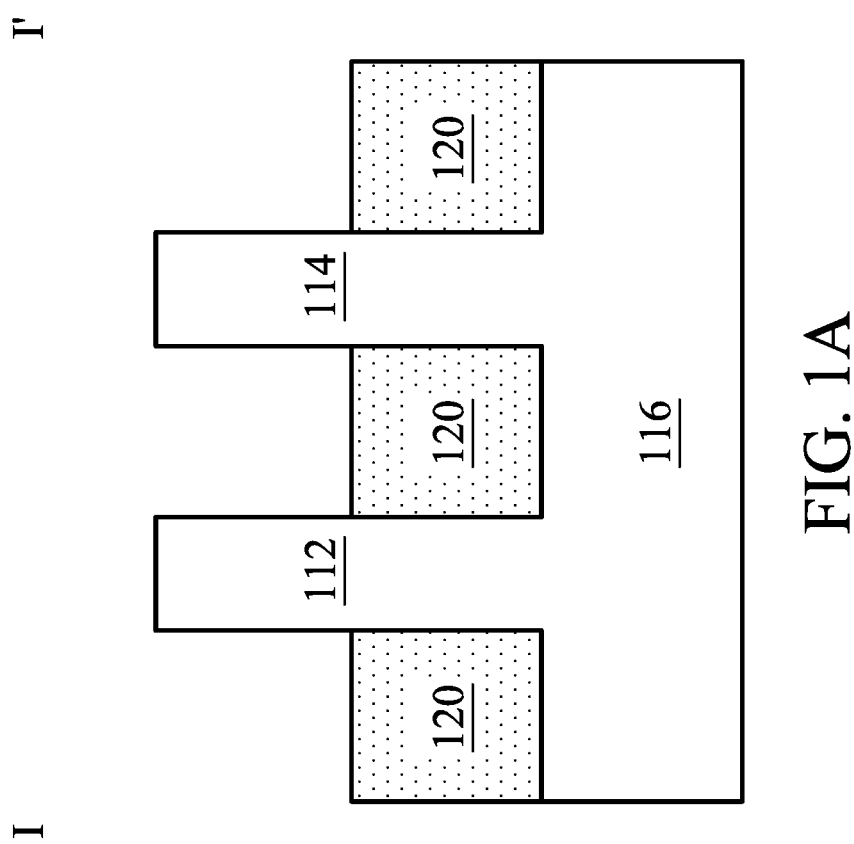
FIGS. 1A-1F are cross-sectional views of various stages of a process for forming a semiconductor device structure, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Figures 1, 1A:
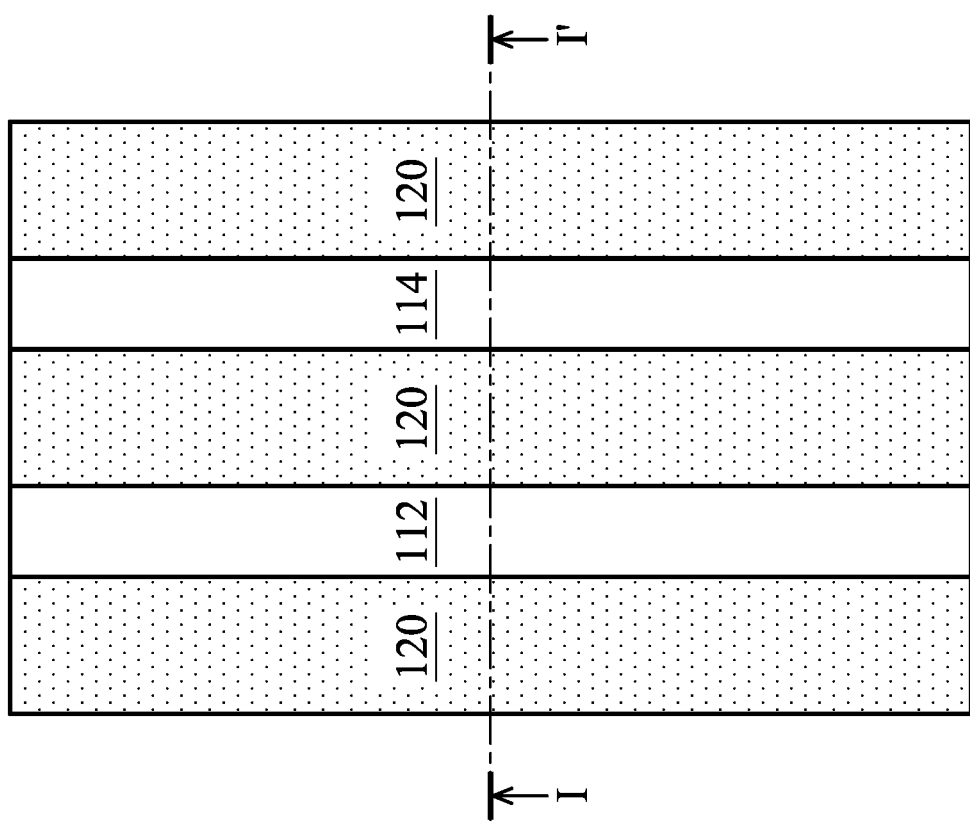
Figures 1, 1A, 2:
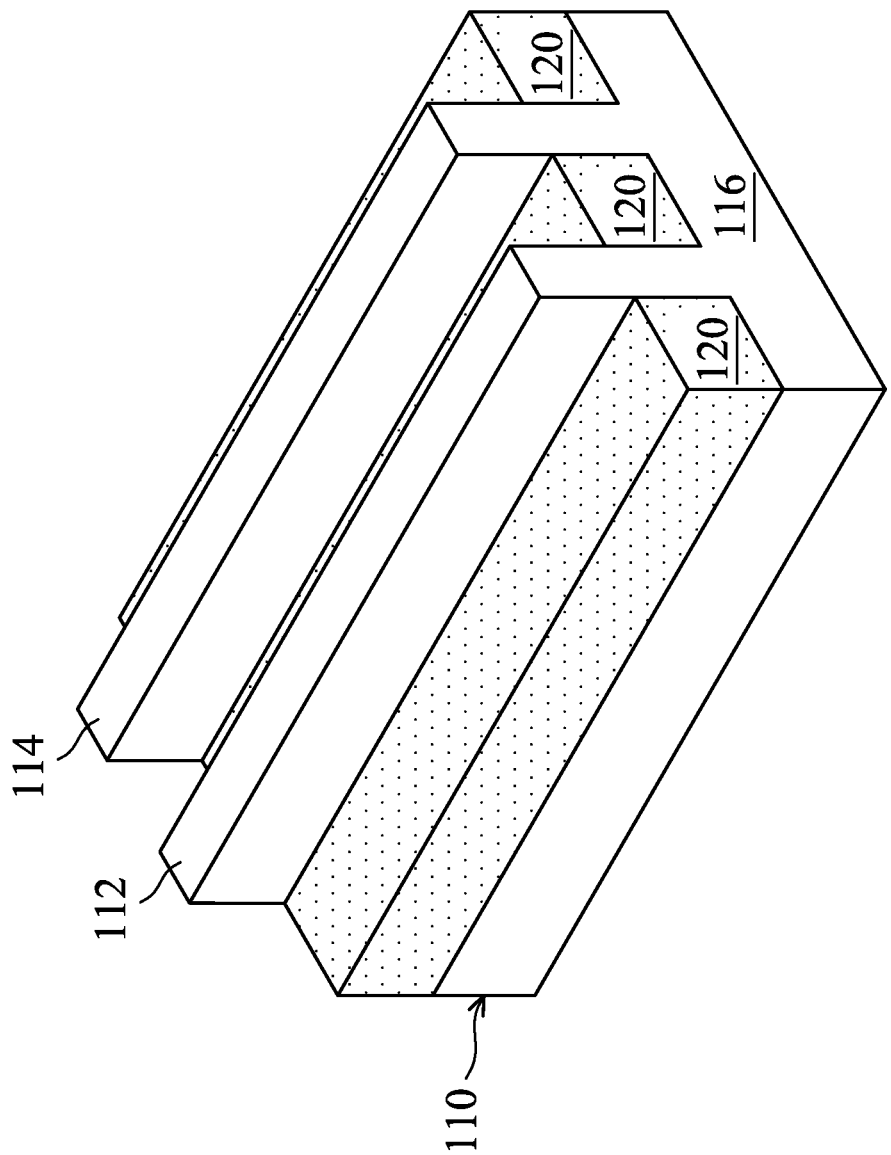

FIGS. 1A-1F are cross-sectional views of various stages of a process for forming a semiconductor device structure, in accordance with some embodiments. FIG. 1A-1 is a top view of the semiconductor device structure of FIG. 1A, in accordance with some embodiments. FIG. 1A is a cross-sectional view illustrating the semiconductor device structure along a sectional line I-I' in FIG. 1A-1, in accordance with some embodiments. FIG. 1A-2 is a perspective view of the semiconductor device structure of FIG. 1A, in accordance with some embodiments.

As shown in FIGS. 1A, 1A-1, and 1A-2, a substrate 110 is provided, in accordance with some embodiments. The substrate 110 includes, for example, a semiconductor substrate. The semiconductor substrate includes, for example, a semiconductor wafer (such as a silicon wafer) or a portion of a semiconductor wafer.

In some embodiments, the substrate 110 is made of an elementary semiconductor material including silicon or germanium in a single crystal, polycrystal, or amorphous structure. In some other embodiments, the substrate 110 is made of a compound semiconductor, such as silicon carbide, gallium arsenide, gallium phosphide, indium phosphide, indium arsenide, an alloy semiconductor, such as SiGe, or GaAsP, or a combination thereof. The substrate 110 may also include multi-layer semiconductors, semiconductor on insulator (SOI) (such as silicon on insulator or germanium on insulator), or a combination thereof.

As shown in FIGS. 1A, 1A-1, and 1A-2, the substrate 110 has fin portions 112 and 114 and a base portion 116, in accordance with some embodiments. The fin portions 112 and 114 are over the base portion 116, in accordance with some embodiments. The fin portions 112 and 114 are spaced apart from each other, in accordance with some embodiments.

As shown in FIG. 1A, an isolation layer 120 is formed over the base portion 116, in accordance with some embodiments. Each of the fin portion 112 or 114 is partially in the isolation layer 120, in accordance with some embodiments. The isolation layer 120 surrounds lower portions of the fin portions 112 and 114, in accordance with some embodiments. The isolation layer 120 includes oxide (such as silicon oxide), in accordance with some embodiments. The isolation layer 120 is formed by a chemical vapor deposition (CVD) process and an etching back process, in accordance with some embodiments.

Figure 1B:
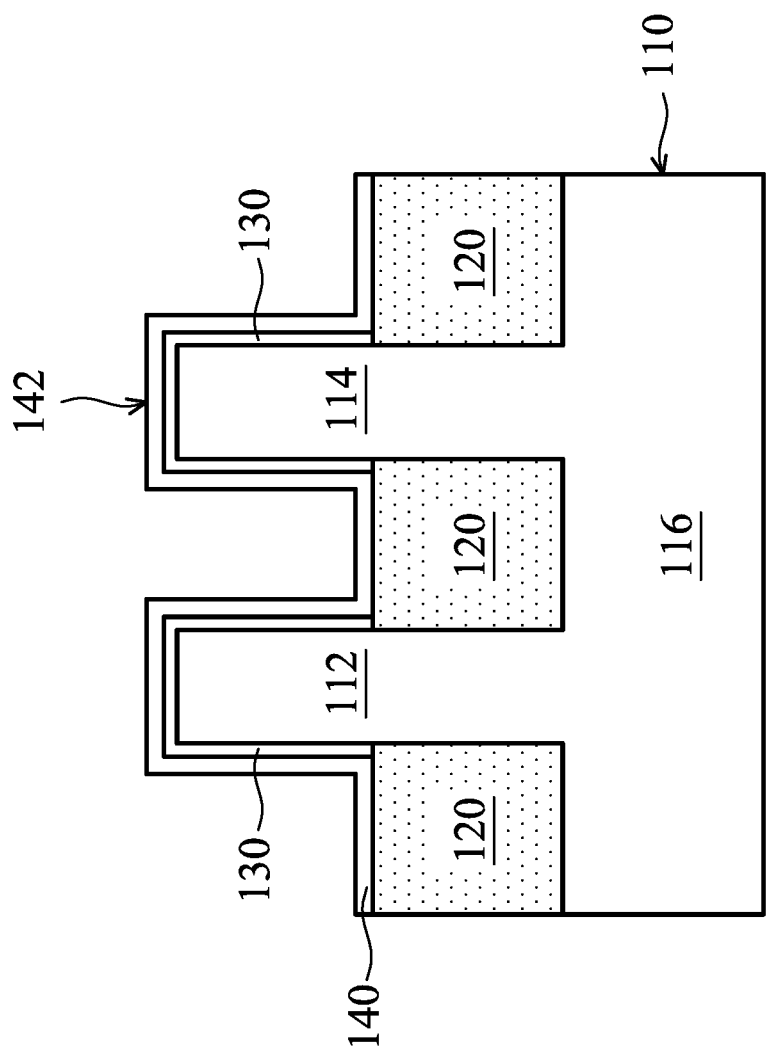

As shown in FIG. 1B, a semiconductor oxynitride layer 130 is formed over the fin portions 112 and 114, in accordance with some embodiments. The semiconductor oxynitride layer 130 conformally covers the fin portions 112 and 114, in accordance with some embodiments. The semiconductor oxynitride layer 130 is used to prevent or reduce oxidation of the fin portions 112 and 114 in subsequent processes by separating the fin portions 112 and 114 from environmental oxygen, in accordance with some embodiments.

The semiconductor oxynitride layer 130 is made of silicon oxynitride ($Si_xO_yN_z$, where x, y and z are positive integers) or another suitable semiconductor oxynitride material. The semiconductor oxynitride layer 130 is formed using a rapid thermal nitridation (RTN) treatment, in accordance with some embodiments. The rapid thermal nitridation treatment is performed at about 400° C. to about 1000° C., in accordance with some embodiments. The rapid thermal nitridation treatment uses a process gas including ammonia ($NH_3$), nitrogen ($N_2$), and/or hydrogen ($H_2$), in accordance with some embodiments.

Figure 3:
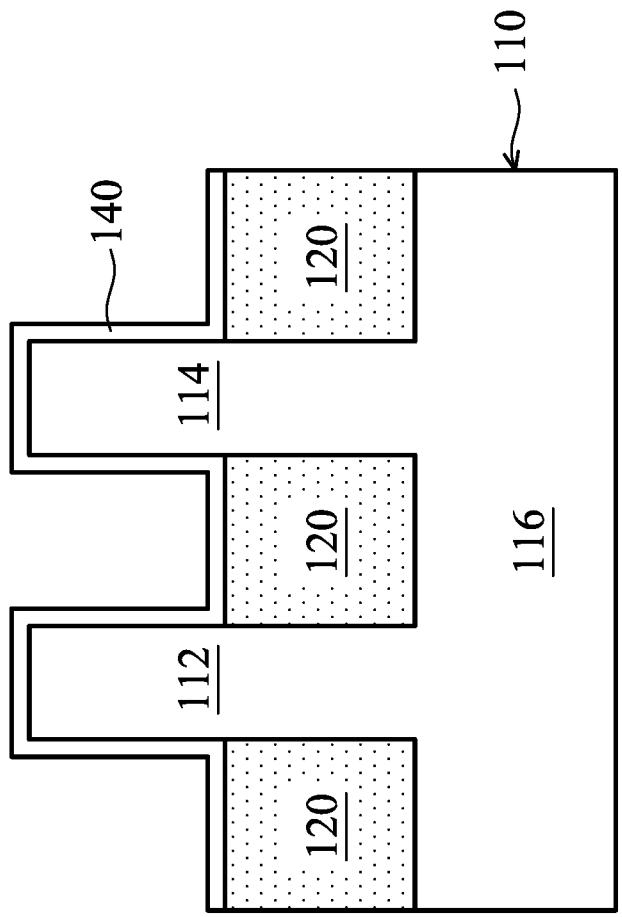
FIG. 3 is a cross-sectional view of a stage of a process for forming a semiconductor device structure, in accordance with some embodiments.

As shown in FIG. 1B, a gate dielectric layer 140 is deposited over the isolation layer 120 and the semiconductor oxynitride layer 130, in accordance with some embodiments. The gate dielectric layer 140 conformally covers the isolation layer 120 and the semiconductor oxynitride layer 130, in accordance with some embodiments. The gate dielectric layer 140 is made of oxide, such as silicon oxide (e.g. $SiO_2$), in accordance with some embodiments. The gate dielectric layer 140 is also referred to as an oxide layer, in accordance with some embodiments. In some other embodiments, as shown in FIG. 3, the semiconductor oxynitride layer 130 is not formed, and the gate dielectric layer 140 is in direct contact with the fin portions 112 and 114.

The gate dielectric layer 140 is deposited using a chemical vapor deposition (CVD) process, a thermal atomic layer deposition (ALD) process, a plasma enhanced atomic layer deposition (PEALD) process, or another suitable deposition process. Since the gate dielectric layer 140 is formed using a deposition process, not an oxidation process, the undesired oxidation of the fin portions 112 and 114 is prevented or reduced during the formation of the gate dielectric layer 140, in accordance with some embodiments.

As shown in FIG. 1B, the gate dielectric layer 140 is annealed, in accordance with some embodiments. The annealing temperature ranges from about 500° C. to about 1000° C., in accordance with some embodiments. The gate dielectric layer 140 is annealed using an annealing gas containing nitrous oxide ($N_2O$), in accordance with some embodiments. In some embodiments, nitrous oxide can be an oxygen source to compensate for the oxygen vacancy in the gate dielectric layer 140 adjacent to the surface 142 of the gate dielectric layer 140.

Since the volume of nitrous oxide is too large to diffuse into the gate dielectric layer 140, the fin portions 112 and 114 are almost not oxidized by reacting with nitrous oxide during the annealing process, in accordance with some embodiments. The gate dielectric layer 140 becomes dense after the annealing process, in accordance with some embodiments. Therefore, the annealing process improves the stability, the dielectric property, and the reliability of the gate dielectric layer 140, in accordance with some embodiments.

Figure 1C:
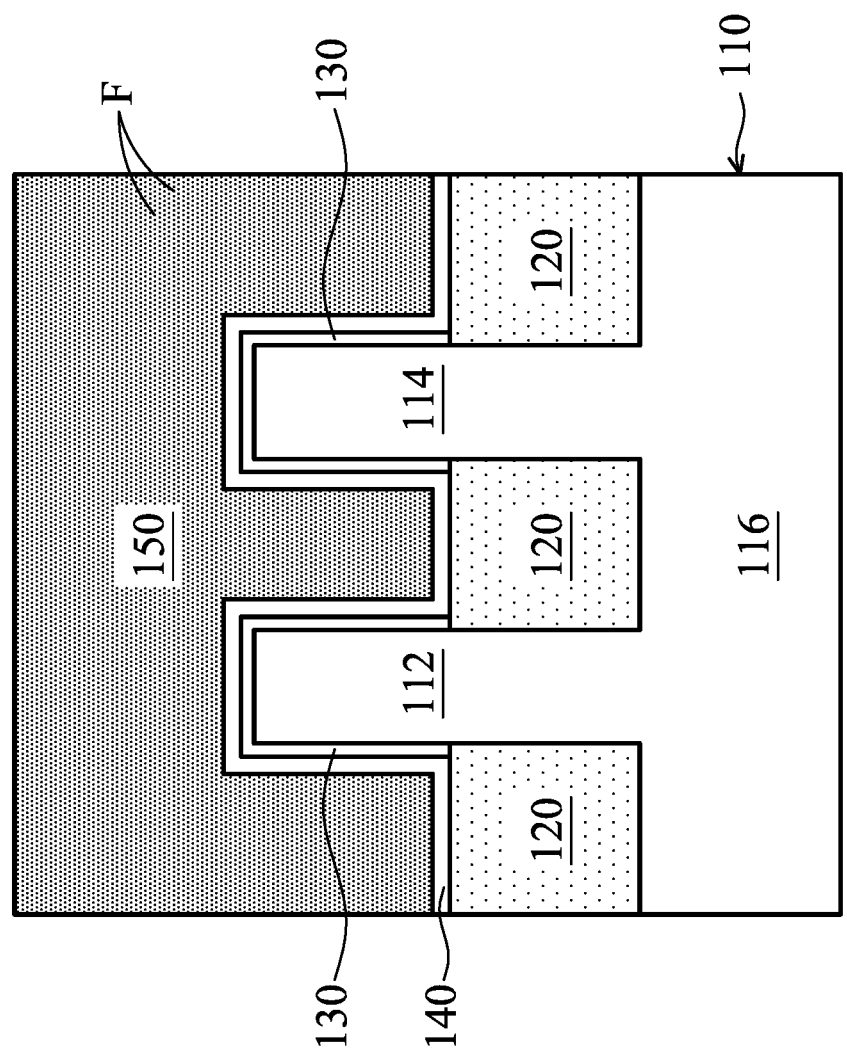

As shown in FIG. 1C, a gate electrode layer 150 is formed over the gate dielectric layer 140, in accordance with some embodiments. The gate electrode layer 150 includes fluorine F, in accordance with some embodiments. The concentration (i.e., the atomic percentage) of the fluorine F within the gate electrode layer 150 ranges from about 0.000001% to about 10%, in accordance with some embodiments. The concentration of the fluorine F within the gate electrode layer 150 ranges from about 0.1% to about 10%, in accordance with some embodiments. The concentration of the fluorine F within the gate electrode layer 150 ranges from about 0.1% to about 1%, in accordance with some embodiments.

The gate electrode layer 150 is in direct contact with the gate dielectric layer 140, in accordance with some embodiments. The gate electrode layer 150 is made of polysilicon, in accordance with some embodiments. The gate electrode layer 150 is formed using a chemical vapor deposition process or another suitable process.

Figure 1D:
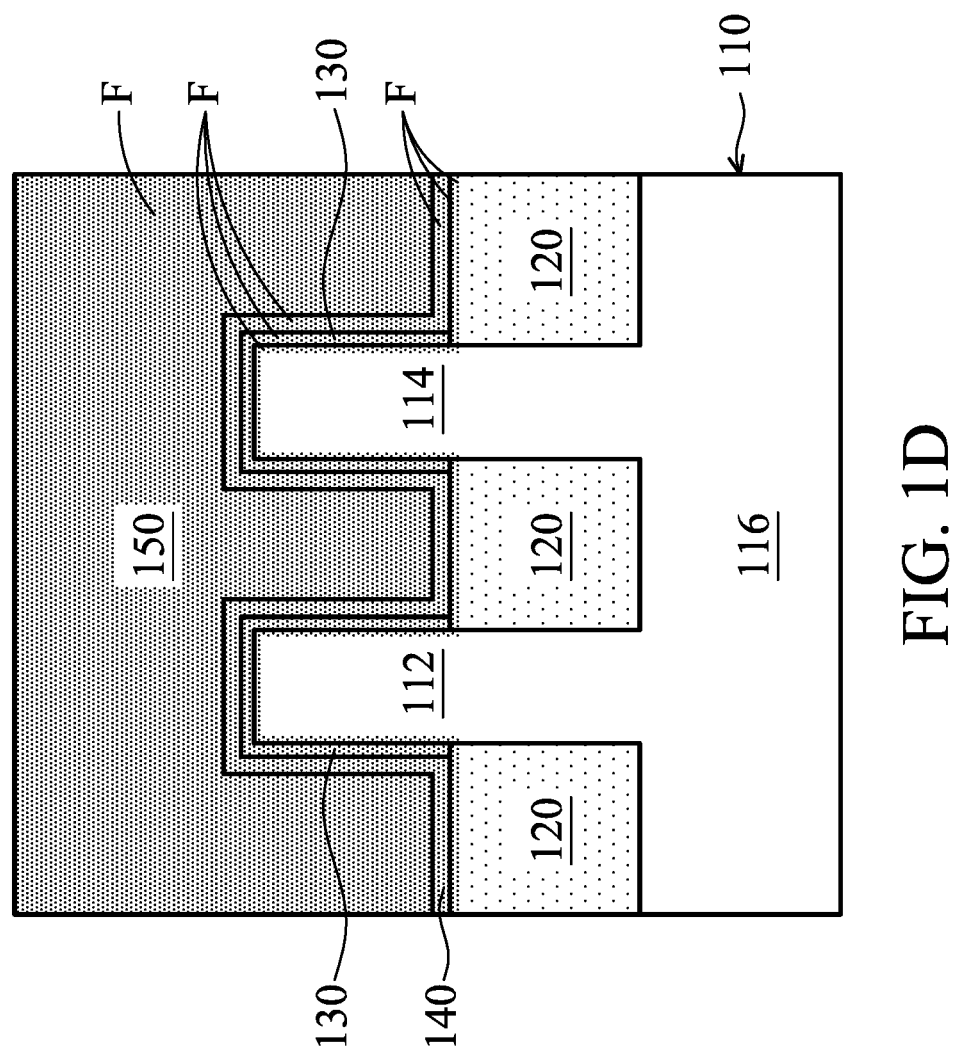

As shown in FIG. 1D, the gate electrode layer 150 and the gate dielectric layer 140 are annealed so that the fluorine F from the gate electrode layer 150 diffuses into the gate dielectric layer 140, in accordance with some embodiments.

The fluorine F bonds to the dangling bonds of the silicon of the gate dielectric layer 140, in accordance with some embodiments.

Therefore, the stability, the dielectric property, and the reliability of the gate dielectric layer 140 are improved, in accordance with some embodiments. As a result, a thickness of the gate dielectric layer 140 may be reduced and may be still able to provide an acceptable dielectric property (i.e., an acceptable dielectric constant). Therefore, the distance between the fin portions 112 and 114 may be reduced.

In some embodiments, the fluorine F coming from the gate electrode layer 150 diffuses into the semiconductor oxynitride layer 130. In some embodiments, the fluorine F coming from the gate electrode layer 150 diffuses into the isolation layer 120 through the gate dielectric layer 140. The concentration of the fluorine F in the isolation layer 120 continuously increases along a direction from the isolation layer 120 toward the gate electrode layer 150, in accordance with some embodiments.

In some embodiments, the fluorine F coming from the gate electrode layer 150 diffuses into the fin portions 112 and 114. The concentration of the fluorine F in the fin portion 112 (or the fin portion 114) continuously increases along a direction from the fin portion 112 (or the fin portion 114) toward the gate electrode layer 150, in accordance with some embodiments.

The fluorine F bonds to the dangling bonds of the silicon of the fin portions 112 and 114, in accordance with some embodiments. Therefore, the stability and the reliability of the fin portions 112 and 114 are improved, in accordance with some embodiments. The annealing temperature ranges from about 500° C. to about 1200° C., in accordance with some embodiments.

Figure 1E:
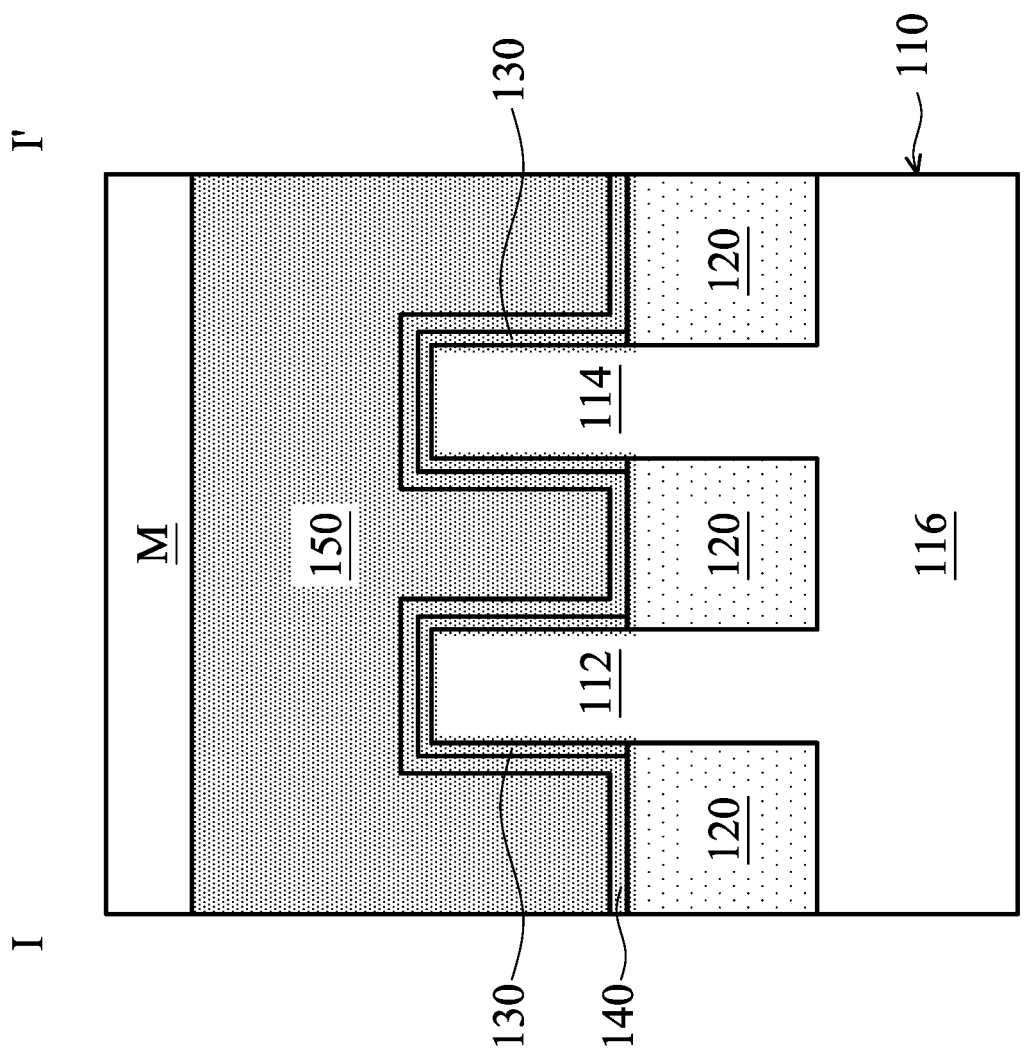

FIG. 1E-1 is a top view of the semiconductor device structure of FIG. 1E, in accordance with some embodiments. FIG. 1E is a cross-sectional view illustrating the semiconductor device structure along a sectional line I-I' in FIG. 1E-1, in accordance with some embodiments. As shown in FIGS. 1E and 1E-1, a mask layer M is formed over the gate electrode layer 150, in accordance with some embodiments. The mask layer M is made of a photoresist material or another suitable material, which is different from the material of the gate electrode layer 150, in accordance with some embodiments.

Figure 1F:
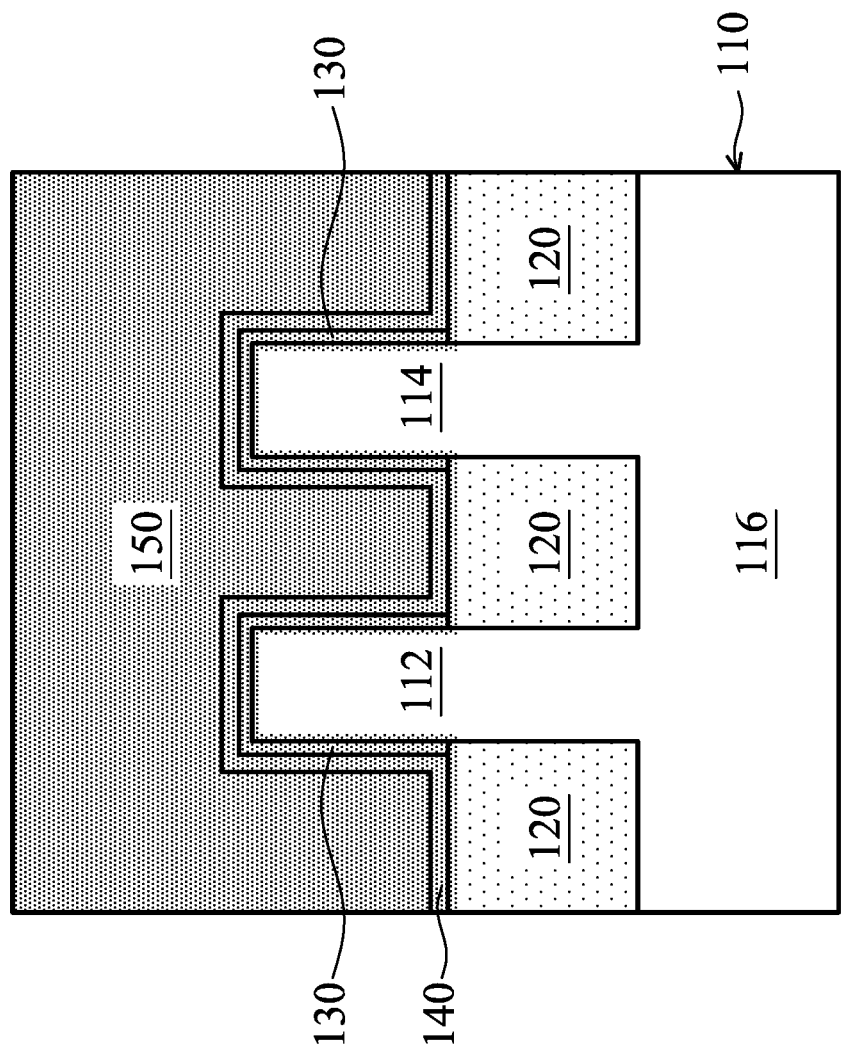
Figures 1, 1F:
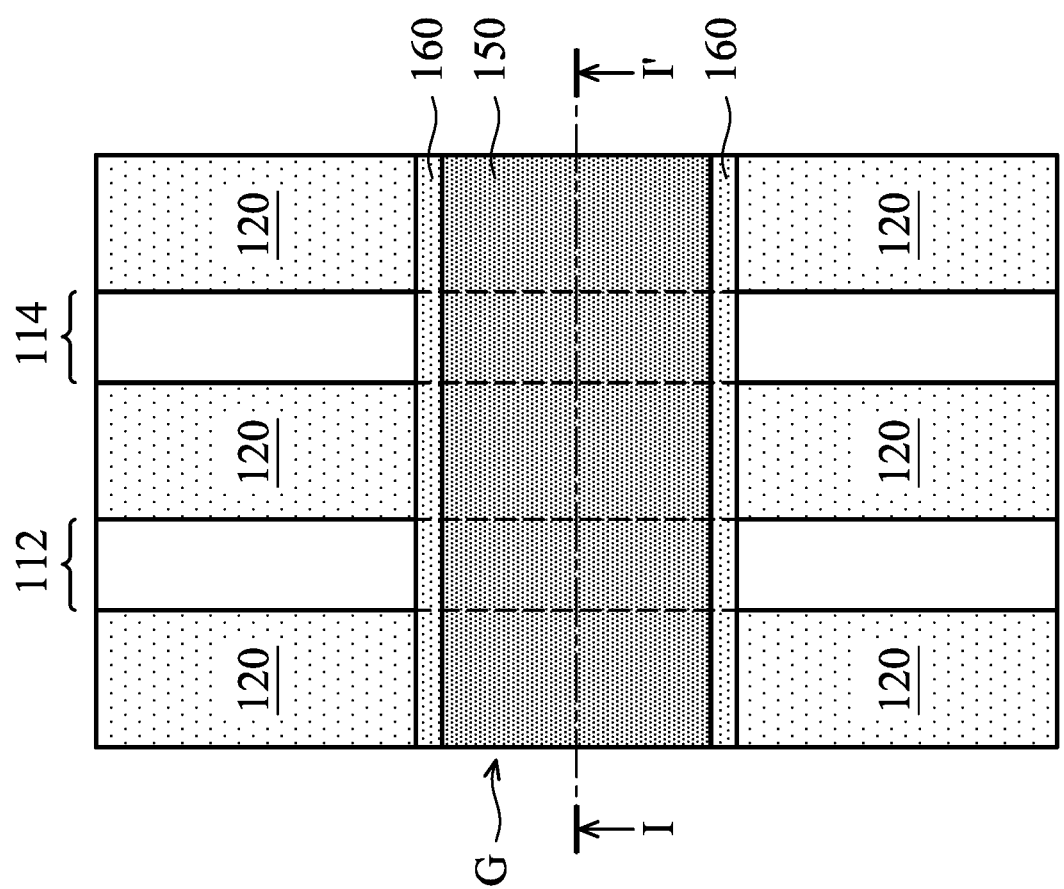
Figures 1, 1F, 2:
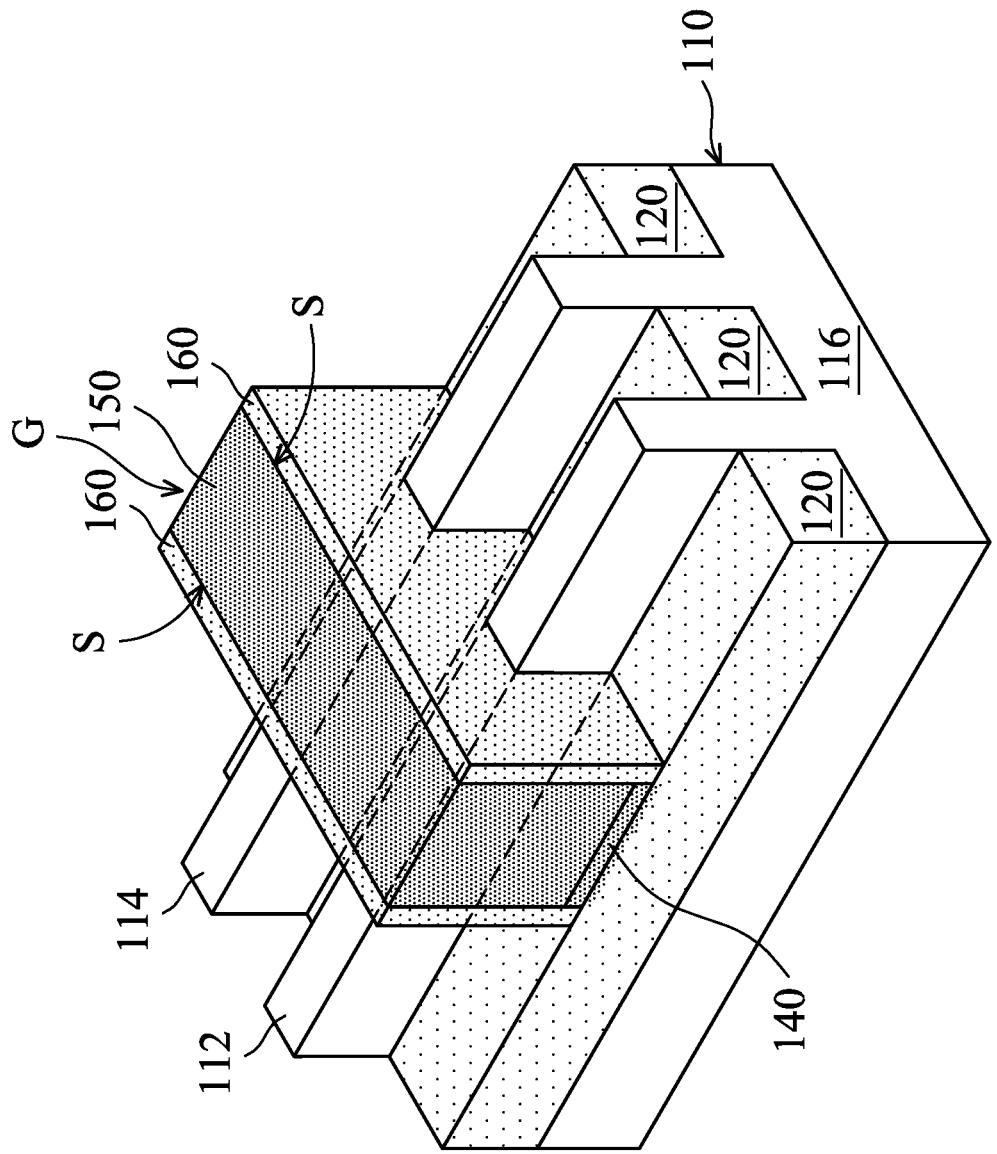

FIG. 1F-1 is a top view of the semiconductor device structure of FIG. 1F, in accordance with some embodiments. FIG. 1F is a cross-sectional view illustrating the semiconductor device structure along a sectional line I-I' in FIG. 1F-1, in accordance with some embodiments. FIG. 1F-2 is a perspective view of the semiconductor device structure of FIG. 1F, in accordance with some embodiments.

As shown in FIGS. 1F, 1F-1, and 1F-2, portions of the gate electrode layer 150, the gate dielectric layers 140, and the semiconductor oxynitride layer 130, which are not under the mask layer M of FIGS. 1E and 1E-1, are removed, in accordance with some embodiments. After the removal process, the remaining gate electrode layer 150, the remaining gate dielectric layer 140, and the remaining semiconductor oxynitride layer 130 together form a gate stack G, in accordance with some embodiments. Thereafter, as shown in FIGS. 1F, 1F-1, and 1F-2, the mask layer M is removed, in accordance with some embodiments.

Afterwards, as shown in FIGS. 1F, 1F-1, and 1F-2, a spacer layer 160 is formed over sidewalls S of the gate stack G, in accordance with some embodiments. The spacer layer 160 surrounds the gate stack G, in accordance with some embodiments. The spacer layer 160 is positioned over the fin portions 112 and 114 and the isolation layer 120, in accordance with some embodiments.

The spacer layer 160 includes insulating materials, such as silicon oxide, silicon nitride, silicon oxynitride, or silicon carbide, in accordance with some embodiments. The formation of the spacer layer 160 includes a deposition process and an anisotropic etching process, in accordance with some embodiments.

Figure 2A:
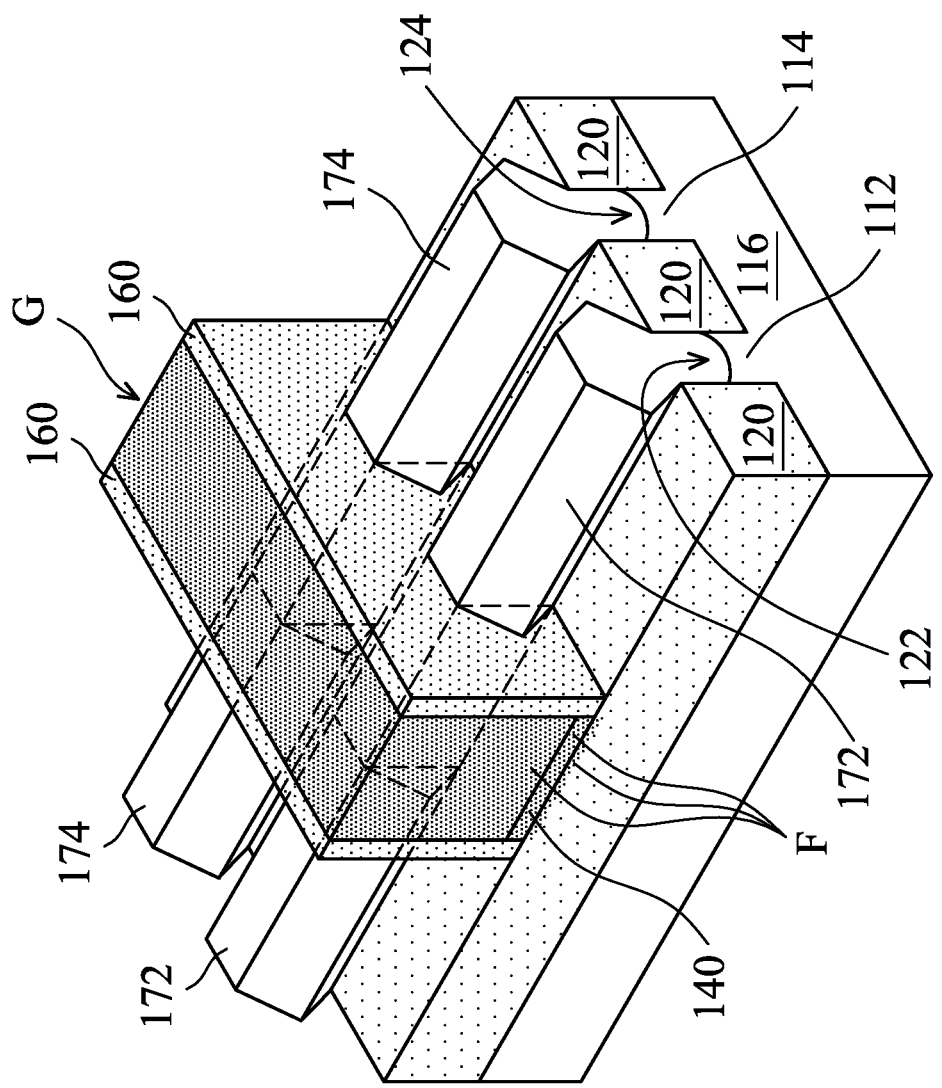
FIGS. 2A-2E are perspective views of various stages of a process for forming a semiconductor device structure, in accordance with some embodiments.

FIGS. 2A-2E are perspective views of various stages of a process for forming a semiconductor device structure, in accordance with some embodiments. After the step illustrated in FIG. 1F, as shown in FIG. 2A, the fin portions 112 and 114 are partially removed, in accordance with some embodiments. After the removal process, as shown in FIG. 2A, trenches 122 and 124 are formed in the isolation layer 120, in accordance with some embodiments.

As shown in FIG. 2A, stressors 172 are formed in the trenches 122 and on the fin portion 112, and stressors 174 are formed in the trenches 124 and on the fin portion 114, in accordance with some embodiments. The stressors 172 are in direct contact with the fin portion 112, in accordance with some embodiments. The stressors 172 are positioned on two opposite sides of the gate stack G, in accordance with some embodiments. The stressors 172 include a source structure and a drain structure, in accordance with some embodiments.

The stressors 174 are in direct contact with the fin portion 114, in accordance with some embodiments. The stressors 174 are positioned on two opposite sides of the gate stack G, in accordance with some embodiments. The stressors 174 include a source structure and a drain structure, in accordance with some embodiments.

The stressors 172 and 174 are made of the same material, in accordance with some embodiments. In some other embodiments, the stressors 172 and 174 are made of different materials, in accordance with some embodiments. The stressors 172 and 174 are made of an N-type conductivity material, in accordance with some embodiments. The N-type conductivity material includes silicon phosphorus (SiP) or another suitable N-type conductivity material. The stressors 172 and 174 are formed using an epitaxial process, in accordance with some embodiments.

The stressors 172 and 174 are doped with the Group VA element, in accordance with some embodiments. The Group VA element includes phosphor (P), antimony (Sb), or another suitable Group VA material. In some embodiments, a concentration of the Group VA element (e.g. phosphor) ranges from about 3E21 atoms/cm$^3$ to about 7E21 atoms/cm$^3$. The stressors 172 and 174 are also referred to as doped structures, in accordance with some embodiments.

In some other embodiments, the stressors 172 and 174 are made of a P-type conductivity material, in accordance with some embodiments. The P-type conductivity material includes silicon germanium (SiGe) or another suitable P-type conductivity material. The stressors 172 and 174 are formed using an epitaxial process, in accordance with some embodiments. The stressors 172 and 174 are doped with the Group IIIA element, in accordance with some embodiments. The Group IIIA element includes boron or another suitable material.

Figure 2B:
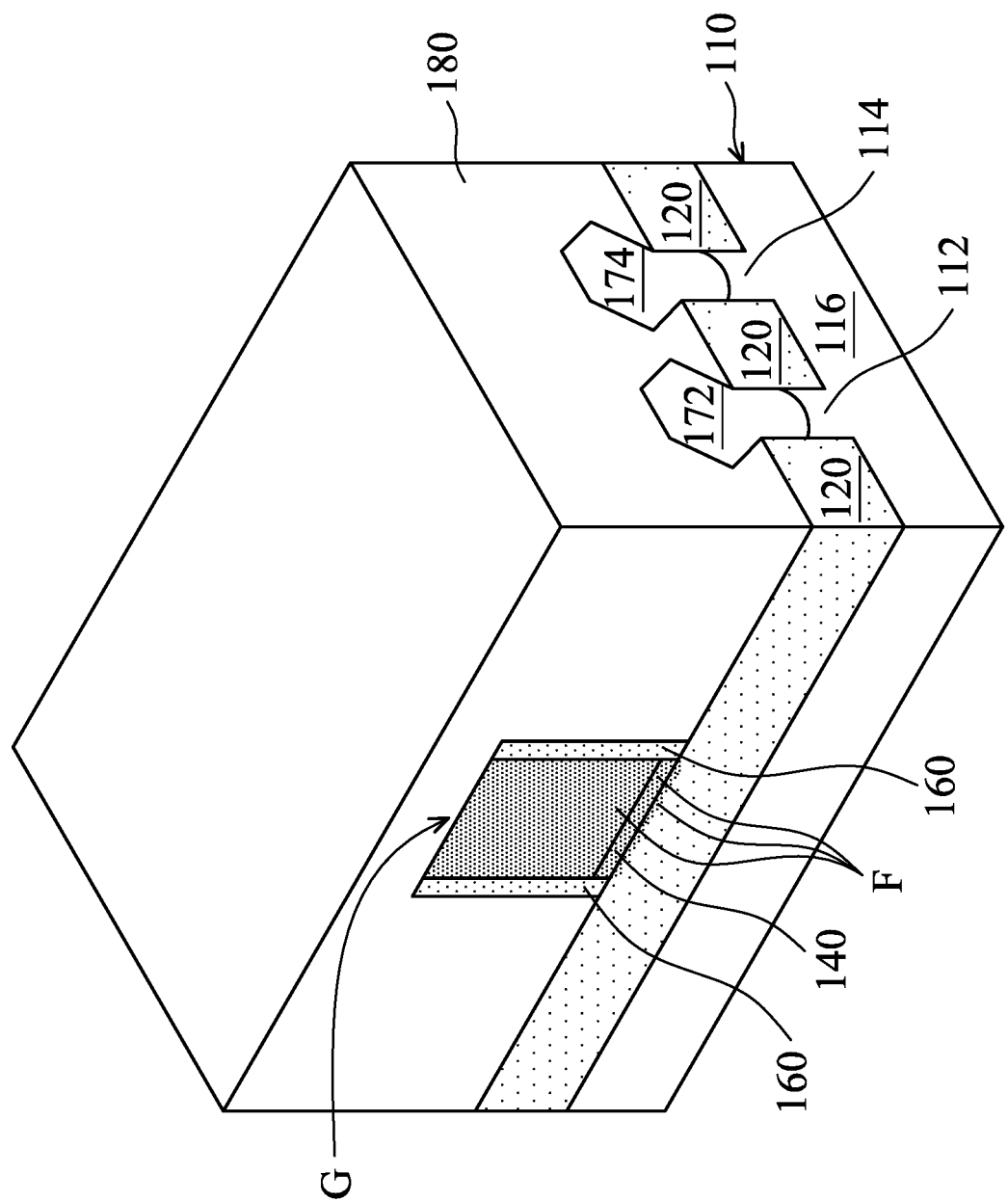

As shown in FIG. 2B, an insulating layer 180 is formed over the gate stack G, the spacer layer 160, the isolation layer 120, and the stressors 172 and 174, in accordance with some embodiments. The insulating layer 180 includes oxide, such as silicon oxide (e.g., SiO$_2$), in accordance with some embodiments. The insulating layer 180 is formed by a chemical vapor deposition (CVD) process, in accordance with some embodiments.

Figure 2C:
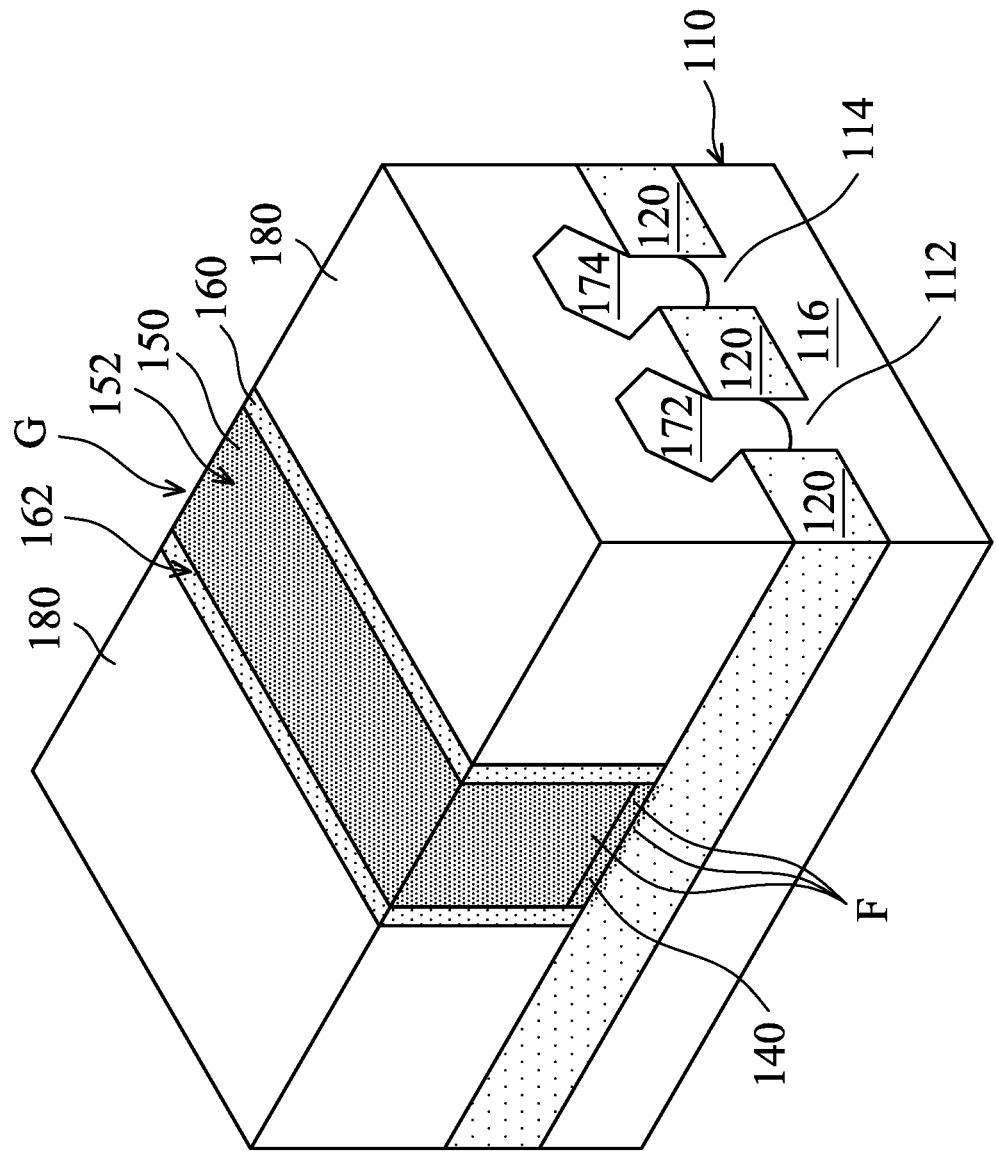

As shown in FIG. 2C, a planarization process is then performed on the insulating layer 180 until a top surface 152 of the gate electrode layer 150 is exposed, in accordance with some embodiments. After the planarization process is performed, a top surface 162 of the spacer layer 160 is exposed, in accordance with some embodiments. The planarization process includes a chemical mechanical polishing (CMP) process, in accordance with some embodiments.

Figure 2D:
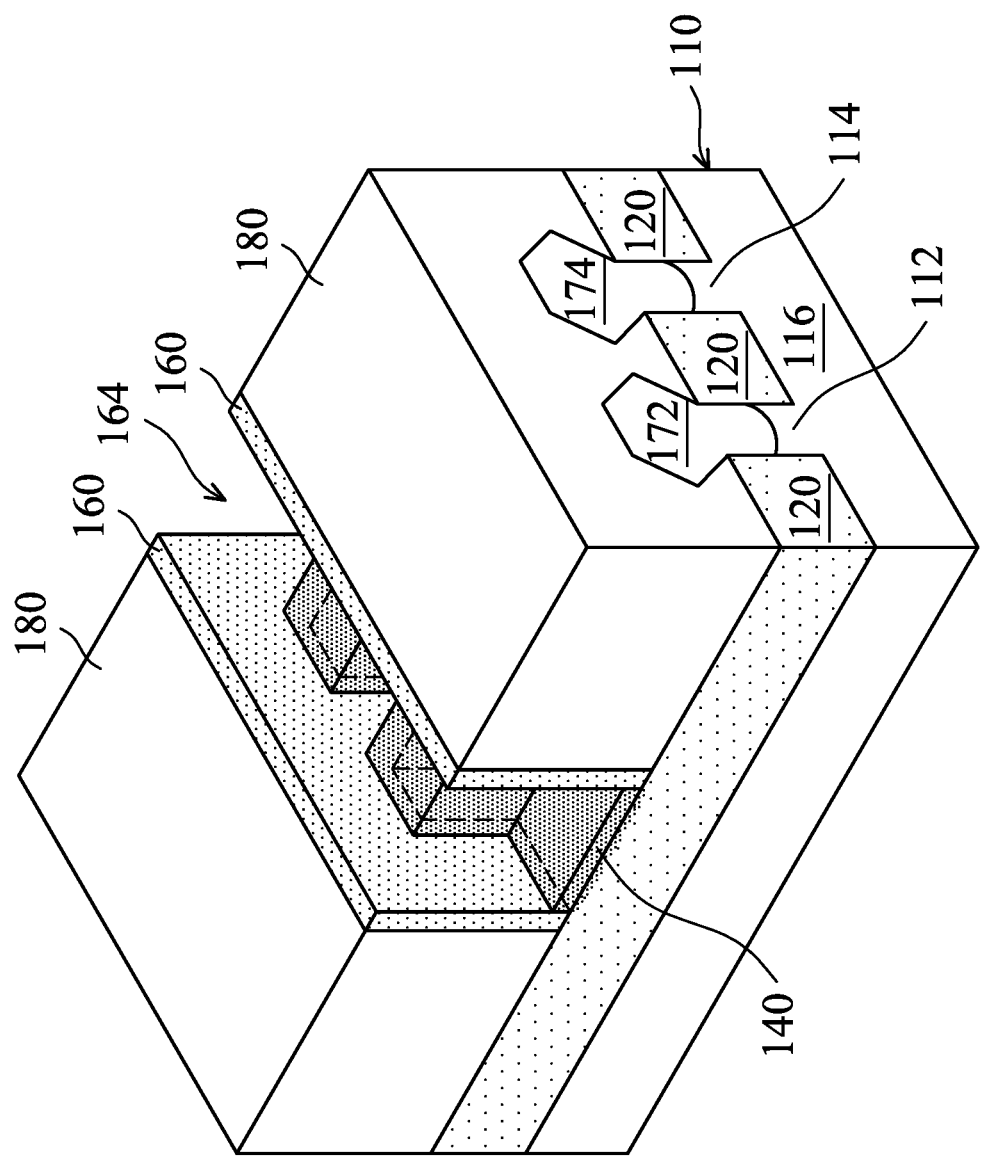

As shown in FIG. 2D, the gate electrode layer 150 is removed, in accordance with some embodiments. The removal process includes a wet etching process, in accordance with some embodiments. After the removal process, a trench 164 is formed in the spacer layer 160, in accordance with some embodiments. The trench 164 exposes the gate dielectric layer 140, in accordance with some embodiments.

Figure 2E:
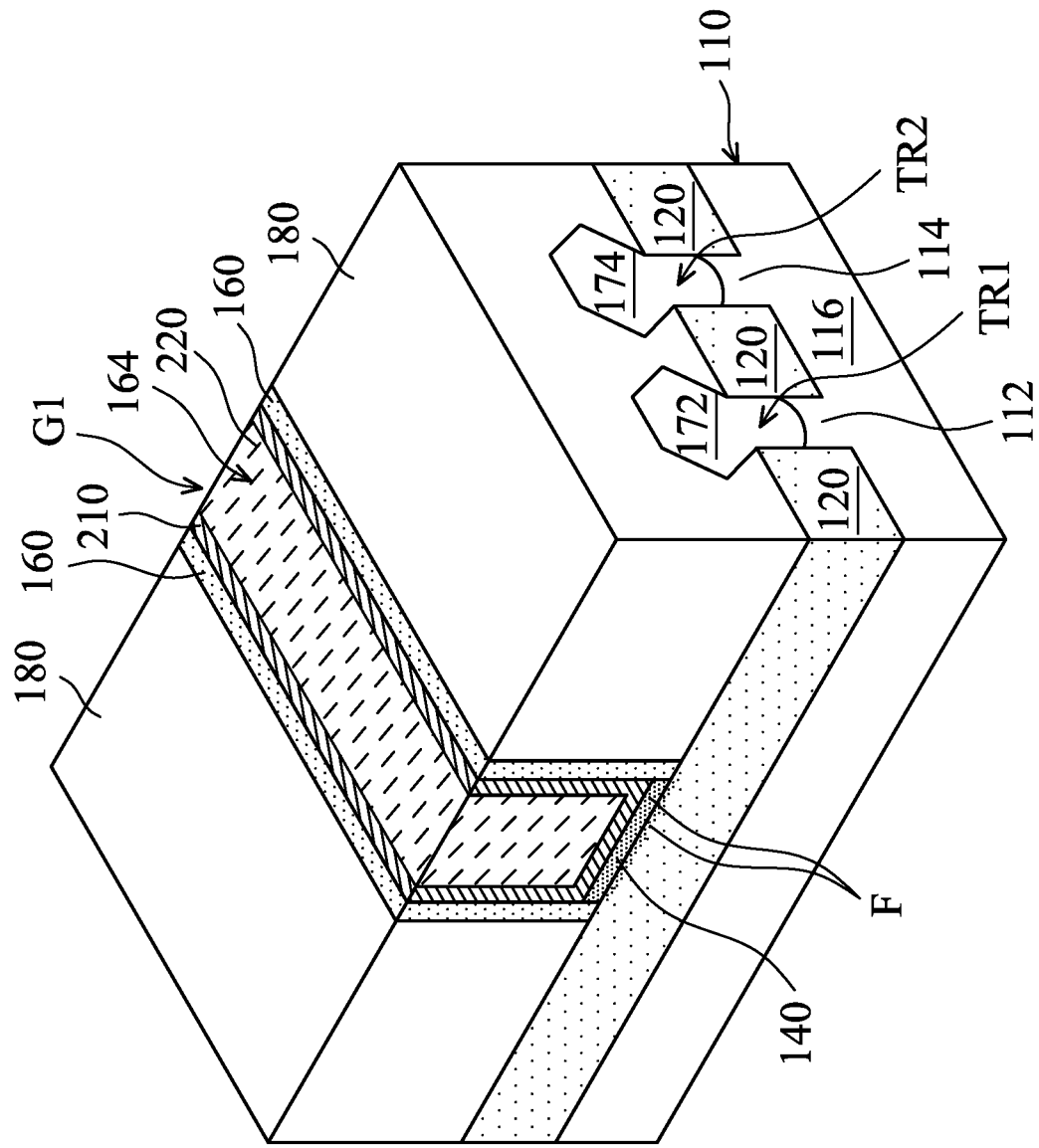

As shown in FIG. 2E, a work function metal layer 210 is formed over the gate dielectric layer 140, in accordance with some embodiments. The work function metal layer 210 conformally covers the gate dielectric layer 140 and the spacer layer 160, in accordance with some embodiments. The work function metal layer 210 provides a desired work function for transistors to enhance device performance including improved threshold voltage.

In the embodiments of forming an NMOS transistor, the work function metal layer 210 can be an n-type metal capable of providing a work function value suitable for the device, such as equal to or less than about 4.5 eV. The n-type metal may be made of metal, metal carbide, metal nitride, or a combination thereof. For example, the n-type metal is made of tantalum, tantalum nitride, or a combination thereof.

In the embodiments of forming a PMOS transistor, the work function metal layer 210 can be a p-type metal capable of providing a work function value suitable for the device, such as equal to or greater than about 4.8 eV. The p-type metal may be made of metal, metal carbide, metal nitride, other suitable materials, or a combination thereof.

For example, the p-type metal is made of titanium, titanium nitride, other suitable materials, or a combination thereof. The work function metal layer 210 is formed using a deposition process and a planarization process, in accordance with some embodiments. The deposition process includes a physical vapor deposition (PVD) process, a CVD process, an atomic layer deposition (ALD), a plating process, another suitable method, or a combination thereof.

Afterwards, as shown in FIG. 2E, a gate electrode layer 220 (also called a metal gate electrode layer) is deposited over the work function metal layer 210 to fill the trench 164, in accordance with some embodiments. The gate electrode layer 220 are made of a suitable metal material, such as aluminum, tungsten, gold, platinum, cobalt, another suitable metal, an alloy thereof, or a combination thereof, in accordance with some embodiments.

The gate electrode layer 220, the work function metal layer 210, and the gate dielectric layer 140 together form a gate stack G1, in accordance with some embodiments. The gate stack G1 and the stressors 172 together form a transistor TR1, in accordance with some embodiments. The gate stack G1 and the stressors 174 together form a transistor TR2, in accordance with some embodiments. The transistors TR1 and TR2 are IO (input/output) transistors, in accordance with some embodiments. Since the stability and the reliability of the gate dielectric layer 140 are improve, the stability and the reliability of the transistors TR1 and TR2 are improve as well.

Figures 1, 4A:
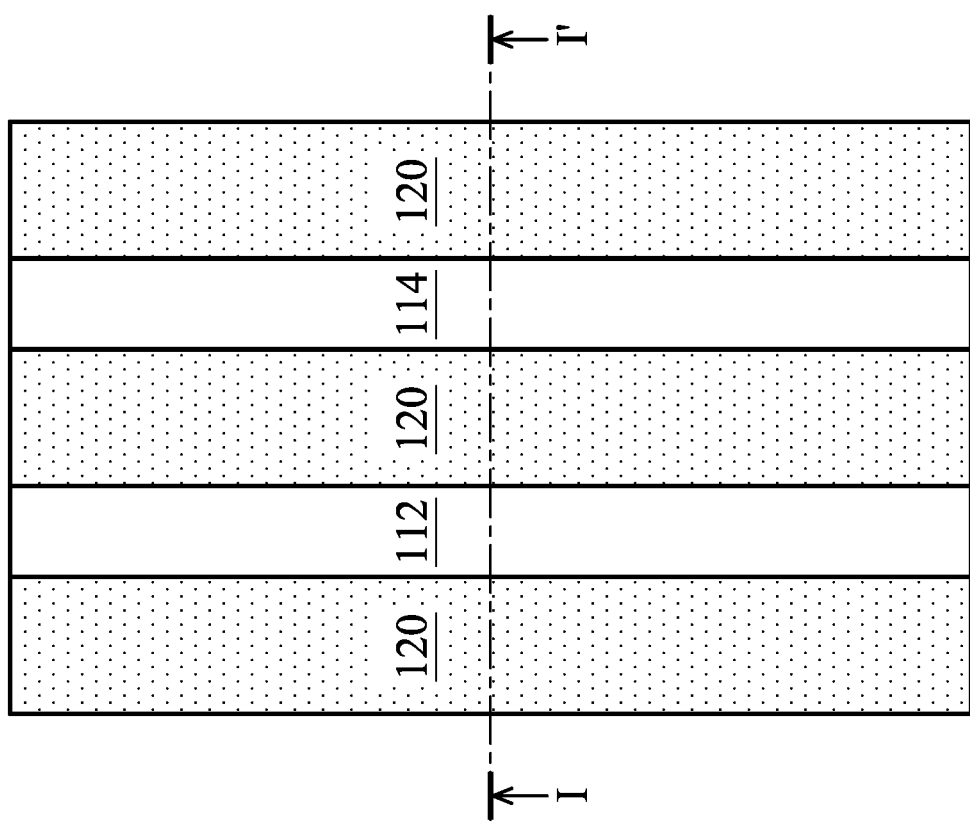
Figures 2, 4A:
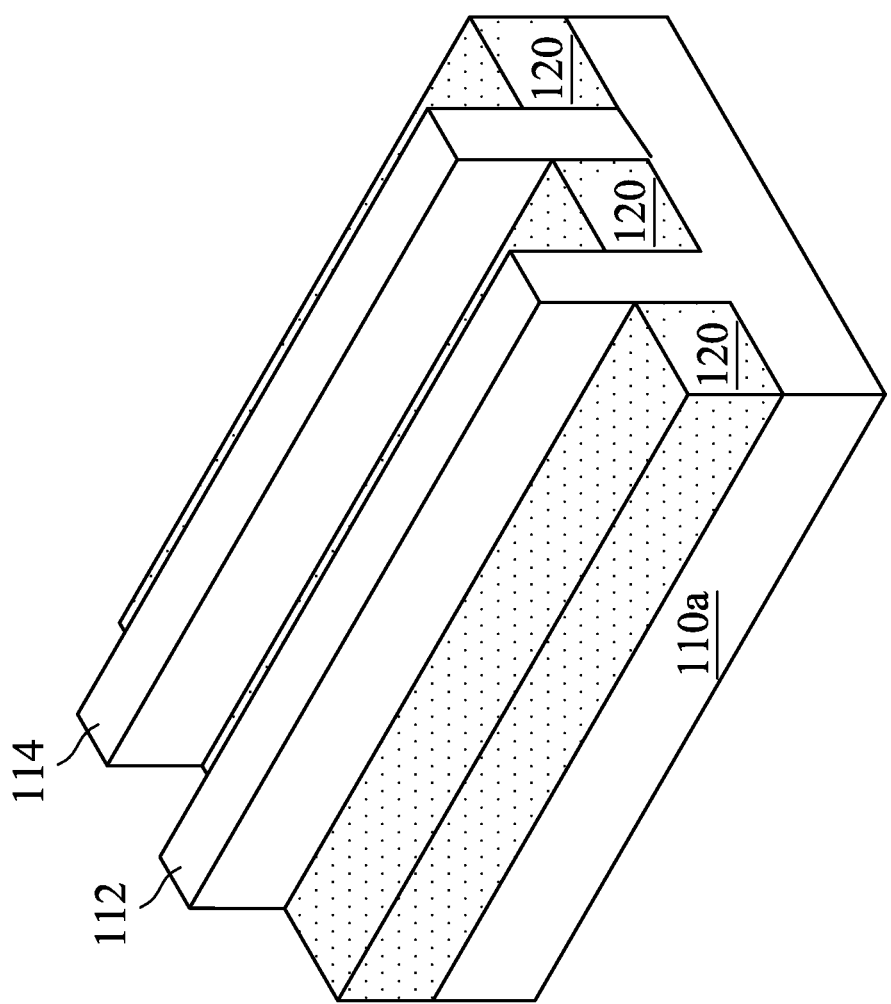
Figure 4B:
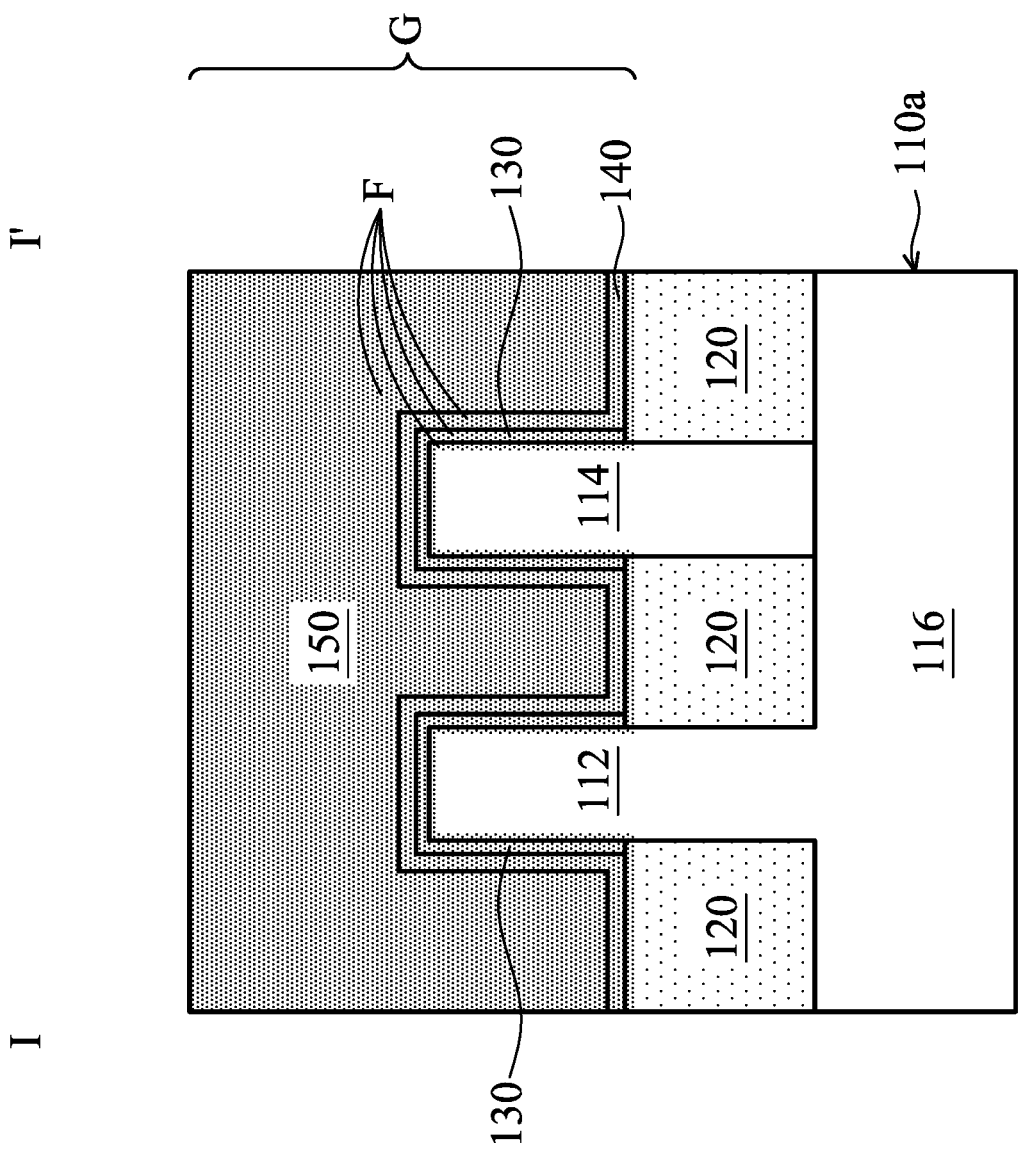
Figures 1, 4B:
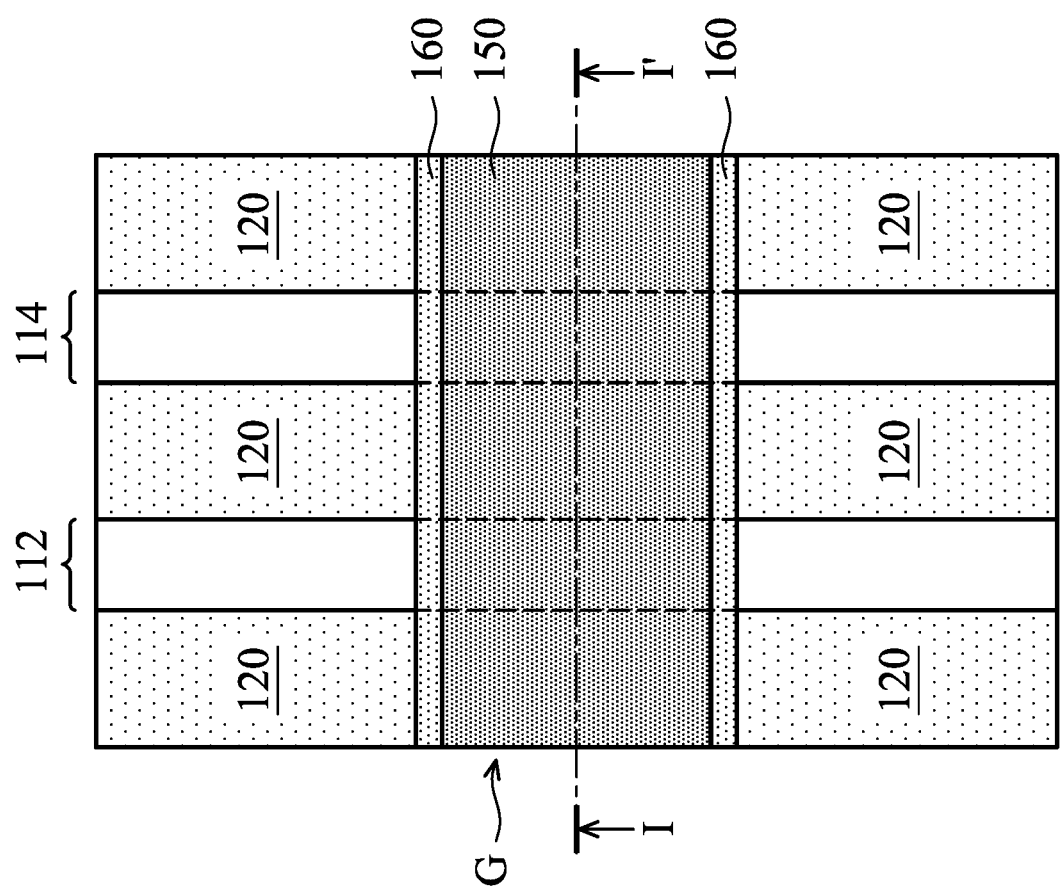
Figures 2, 4B:
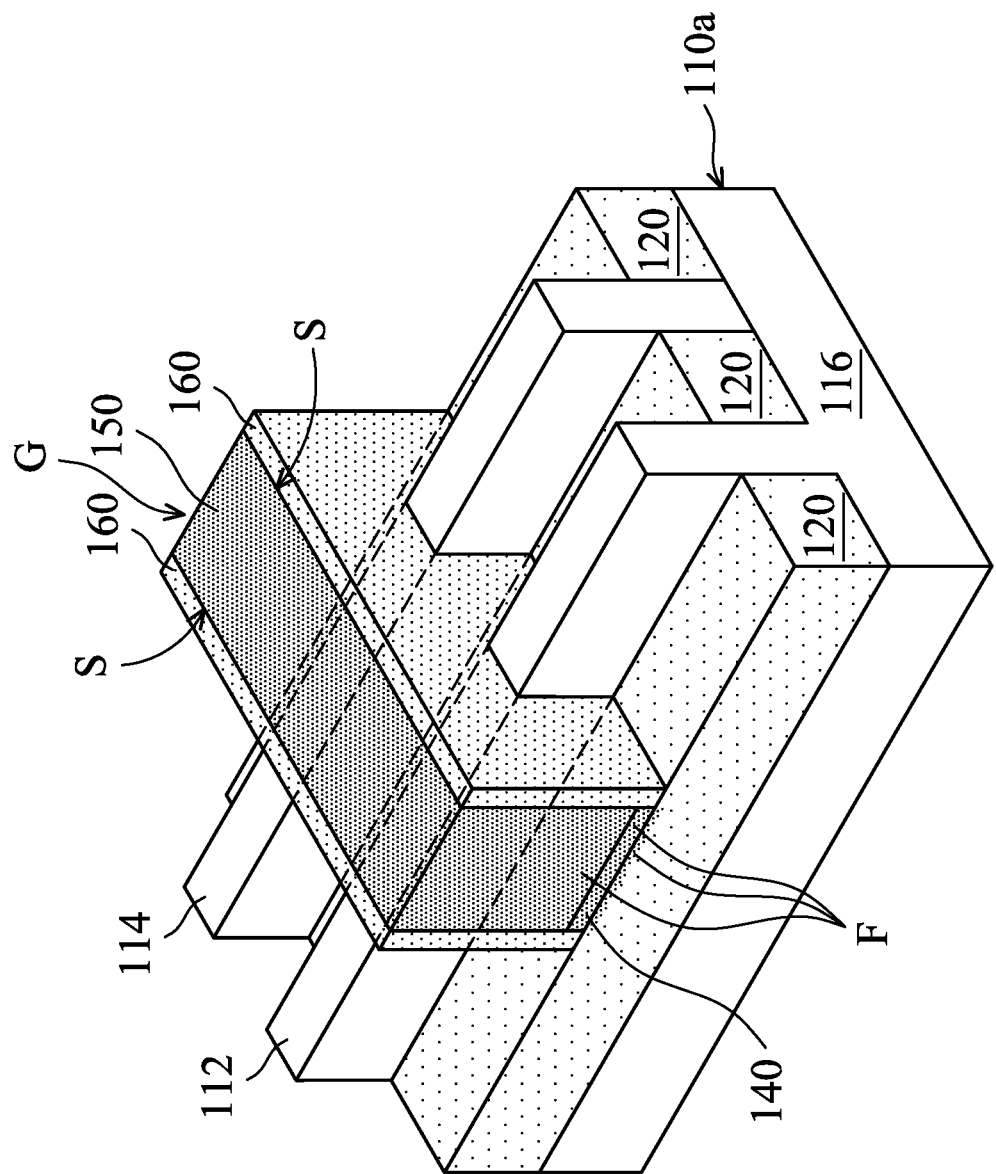

FIGS. 4A-4B are cross-sectional views of various stages of a process for forming a semiconductor device structure, in accordance with some embodiments. FIG. 4A-1 is a top view of the semiconductor device structure of FIG. 4A, in accordance with some embodiments. FIG. 4A is a cross-sectional view illustrating the semiconductor device structure along a sectional line I-I' in FIG. 4A-1, in accordance with some embodiments. FIG. 4A-2 is a perspective view of the semiconductor device structure of FIG. 4A, in accordance with some embodiments.

As shown in FIGS. 4A, 4A-1, and 4A-2, a substrate 110*a* is provided, in accordance with some embodiments. The substrate 110*a* of FIG. 4A is similar to the substrate 110 of FIG. 1A, except that the fin portions 112 and 114 of the substrate 110*a* of FIG. 4A are made of different materials, in accordance with some embodiments. The fin portions 112 and the base portion 116 are both made of a first semiconductor material, in accordance with some embodiments.

The first semiconductor material includes an elementary semiconductor material including silicon or germanium in a single crystal, polycrystal, or amorphous structure. In some other embodiments, the first semiconductor material includes a compound semiconductor, such as silicon carbide, gallium arsenide, gallium phosphide, indium phosphide, indium arsenide, an alloy semiconductor, such as SiGe, or GaAsP, or a combination thereof.

The fin portions 114 are made of a second semiconductor material, in accordance with some embodiments. The second semiconductor material includes an elementary semiconductor material including silicon or germanium in a single crystal, polycrystal, or amorphous structure. In some other embodiments, the first semiconductor material includes a compound semiconductor, such as silicon carbide, gallium arsenide, gallium phosphide, indium phosphide, indium arsenide, an alloy semiconductor, such as SiGe, or GaAsP, or a combination thereof. In some embodiments, the fin portion 112 is made of silicon and the fin portion 114 is made of silicon germanium.

As shown in FIG. 4A, an isolation layer 120 is formed over the base portion 116, in accordance with some embodiments. Each of the fin portion 112 or 114 is partially in the isolation layer 120, in accordance with some embodiments. The isolation layer 120 surrounds lower portions of the fin portions 112 and 114, in accordance with some embodiments. The isolation layer 120 includes oxide (such as silicon oxide), in accordance with some embodiments. The isolation layer 120 is formed by a chemical vapor deposition (CVD) process and an etching back process, in accordance with some embodiments.

FIG. 4B-1 is a top view of the semiconductor device structure of FIG. 4B, in accordance with some embodiments. FIG. 4B is a cross-sectional view illustrating the semiconductor device structure along a sectional line I-I' in FIG. 4B-1, in accordance with some embodiments. FIG. 4B-2 is a perspective view of the semiconductor device structure of FIG. 4B, in accordance with some embodiments.

As shown in FIGS. 4B, 4B-1, and 4B-2, the steps illustrated in FIGS. 1B-1F are performed, in accordance with some embodiments. The gate electrode layer 150, the gate dielectric layer 140, and the semiconductor oxynitride layer 130 together form a gate stack G, in accordance with some embodiments. The gate stack G extends across the fin portions 112 and 114, in accordance with some embodiments. In some embodiments, a spacer layer 160 is formed over sidewalls S of the gate stack G.

The materials and structures of the spacer layer 160, the gate electrode layer 150, the gate dielectric layer 140, the semiconductor oxynitride layer 130, and the isolation layer 120 are respectively the same as or similar to that of the spacer layer 160, the gate electrode layer 150, the gate dielectric layer 140, the semiconductor oxynitride layer 130, and the isolation layer 120 of FIGS. 1F, 1F-1, and 1F-2, in accordance with some embodiments.

Figure 5:
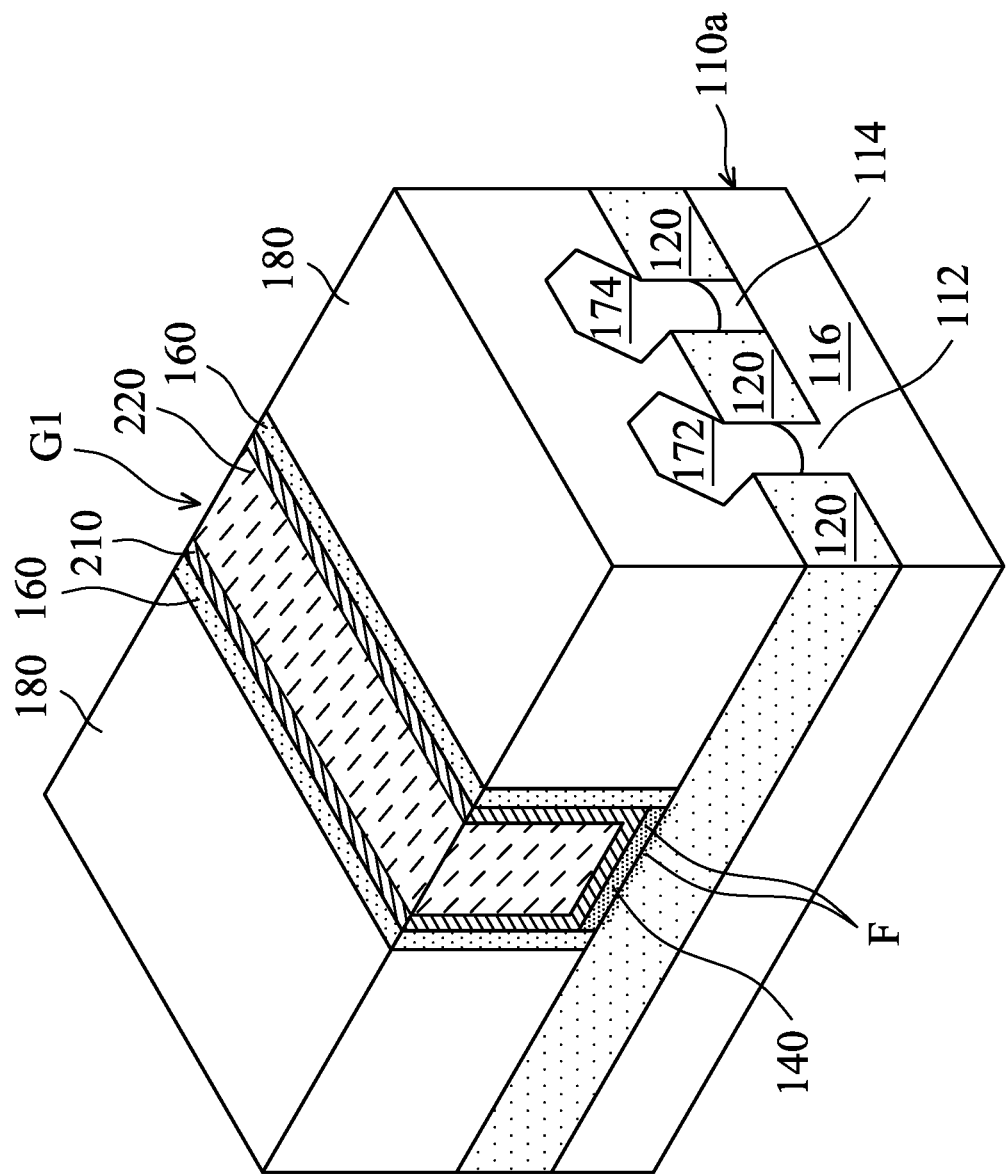
FIG. 5 is a perspective view of a stage of a process for forming a semiconductor device structure, in accordance with some embodiments.

FIG. 5 is a perspective view of a stage of a process for forming a semiconductor device structure, in accordance with some embodiments. As shown in FIG. 5, the steps illustrated in FIGS. 2A-2E are performed, in accordance with some embodiments. As shown in FIG. 5, the insulating layer 180 is formed over the isolation layer 120 and the stressors 172 and 174, in accordance with some embodiments. As shown in FIG. 5, the gate electrode layer 220, the work function metal layer 210, and the gate dielectric layer 140 together form a gate stack G1, in accordance with some embodiments.

The materials and structures of the insulating layer 180, the work function metal layer 210, and the gate electrode layer 220 are respectively the same as or similar to that of the insulating layer 180, the work function metal layer 210, and the gate electrode layer 220 of FIG. 2E, in accordance with some embodiments.

Figure 6A:
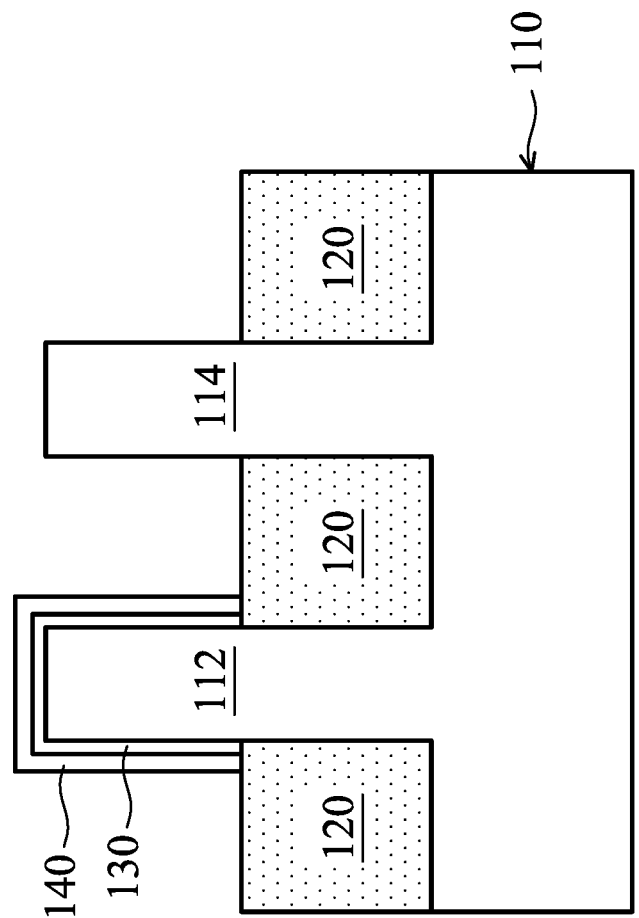
FIGS. 6A-6F are cross-sectional views of various stages of a process for forming a semiconductor device structure, in accordance with some embodiments.

FIGS. 6A-6F are cross-sectional views of various stages of a process for forming a semiconductor device structure, in accordance with some embodiments. As shown in FIG. 6A, the steps illustrated in FIGS. 1A-1B are performed, in accordance with some embodiments. Afterwards, as shown in FIG. 6A, portions of the semiconductor oxynitride layer 130 and the gate dielectric layer 140 over the fin portion 114 are removed, in accordance with some embodiments. In some embodiments, a portion of the gate dielectric layer 140 over the isolation layer 120 is removed.

Figure 6B:
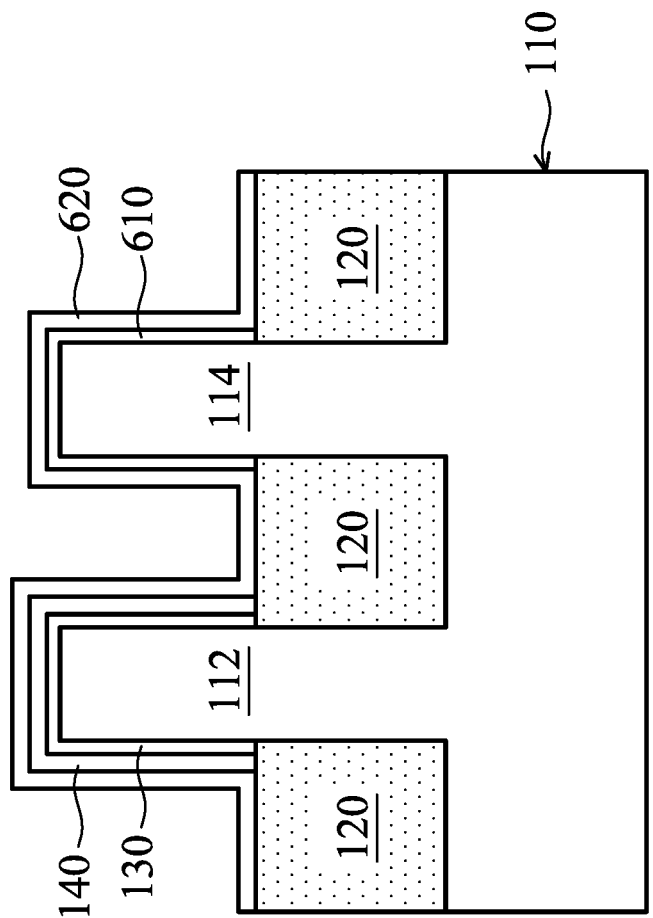

As shown in FIG. 6B, an interlayer 610 is formed over the fin portion 114, in accordance with some embodiments. The interlayer 610 is made of an insulating material, such as oxide (e.g., silicon dioxide), in accordance with some embodiments. The interlayer 610 is formed using a chemical oxidation process, a thermal oxidation process, or a rapid thermal nitridation (RTN) treatment and a chemical oxidation process, in accordance with some embodiments.

The chemical oxidation process uses a solution including, for example, sulphuric acid ($H_2SO_4$) and hydrogen peroxide ($H_2O_2$), in accordance with some embodiments. In some other embodiments, the solution includes ozone and water ($H_2O$). The thermal oxidation process is performed at about 500° C. to about 1000° C., in accordance with some embodiments. The thermal oxidation process uses a process gas including oxygen ($O_2$), nitrogen ($N_2$), hydrogen ($H_2$), and/or nitrous oxide ($N_2O$), in accordance with some embodiments.

Afterwards, as shown in FIG. 6B, a high-K dielectric layer 620 is deposited over the gate dielectric layer 140, the interlayer 610, and the isolation layer 120, in accordance with some embodiments. The high-K dielectric layer 620 conformally covers the gate dielectric layer 140, the interlayer 610, and the isolation layer 120, in accordance with some embodiments. The high-K dielectric layer 620 has a dielectric constant greater than that of silicon dioxide, in accordance with some embodiments.

The high-K dielectric layer 620 is made of hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, another suitable high-K material, or a combination thereof.

Figure 6C:
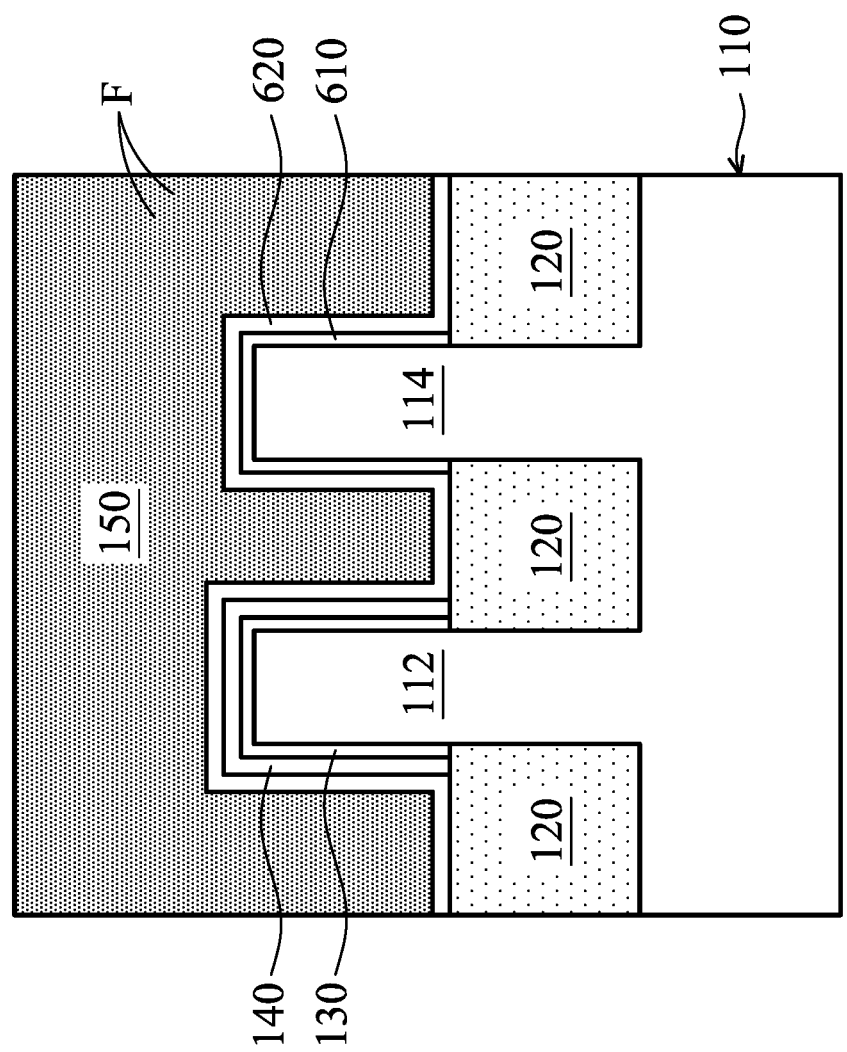

As shown in FIG. 6C, a gate electrode layer 150 is formed over the high-K dielectric layer 620, in accordance with some embodiments. The gate electrode layer 150 includes fluorine F, in accordance with some embodiments. The gate electrode layer 150 is in direct contact with the high-K dielectric layer 620, in accordance with some embodiments. The gate electrode layer 150 is made of polysilicon, in accordance with some embodiments. The gate electrode layer 150 is formed using a chemical vapor deposition process or another suitable process.

Figure 6D:
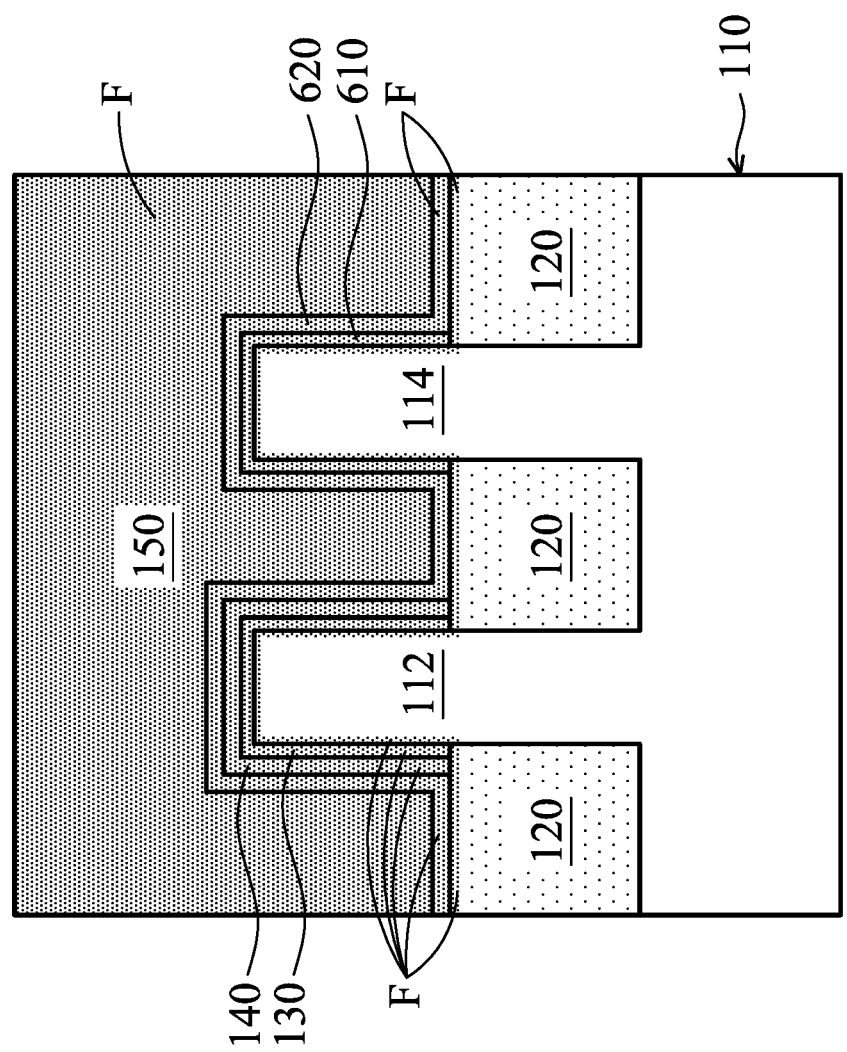

As shown in FIG. 6D, the gate electrode layer 150, the high-K dielectric layer 620, the gate dielectric layer 140, the semiconductor oxynitride layer 130, and the interlayer 610 are annealed so that the fluorine F from the gate electrode layer 150 diffuses into the high-K dielectric layer 620, the gate dielectric layer 140, the semiconductor oxynitride layer 130, and the interlayer 610, in accordance with some embodiments.

The fluorine F bonds to the dangling bonds of the silicon of the high-K dielectric layer 620, the gate dielectric layer 140, the semiconductor oxynitride layer 130, and the interlayer 610, in accordance with some embodiments. Therefore, the stability, the dielectric property, and the reliability of the high-K dielectric layer 620, the gate dielectric layer 140, the semiconductor oxynitride layer 130, and/or the interlayer 610 are improved, in accordance with some embodiments.

In some embodiments, the fluorine F coming from the gate electrode layer 150 diffuses into the isolation layer 120 through the high-K dielectric layer 620. In some embodiments, the fluorine F coming from the gate electrode layer 150 diffuses into the fin portions 112 and 114. The fluorine F bonds to the dangling bonds of the silicon of the fin portions 112 and 114, in accordance with some embodiments. Therefore, the stability and the reliability of the fin portions 112 and 114 are improved, in accordance with some embodiments.

Figure 6E:
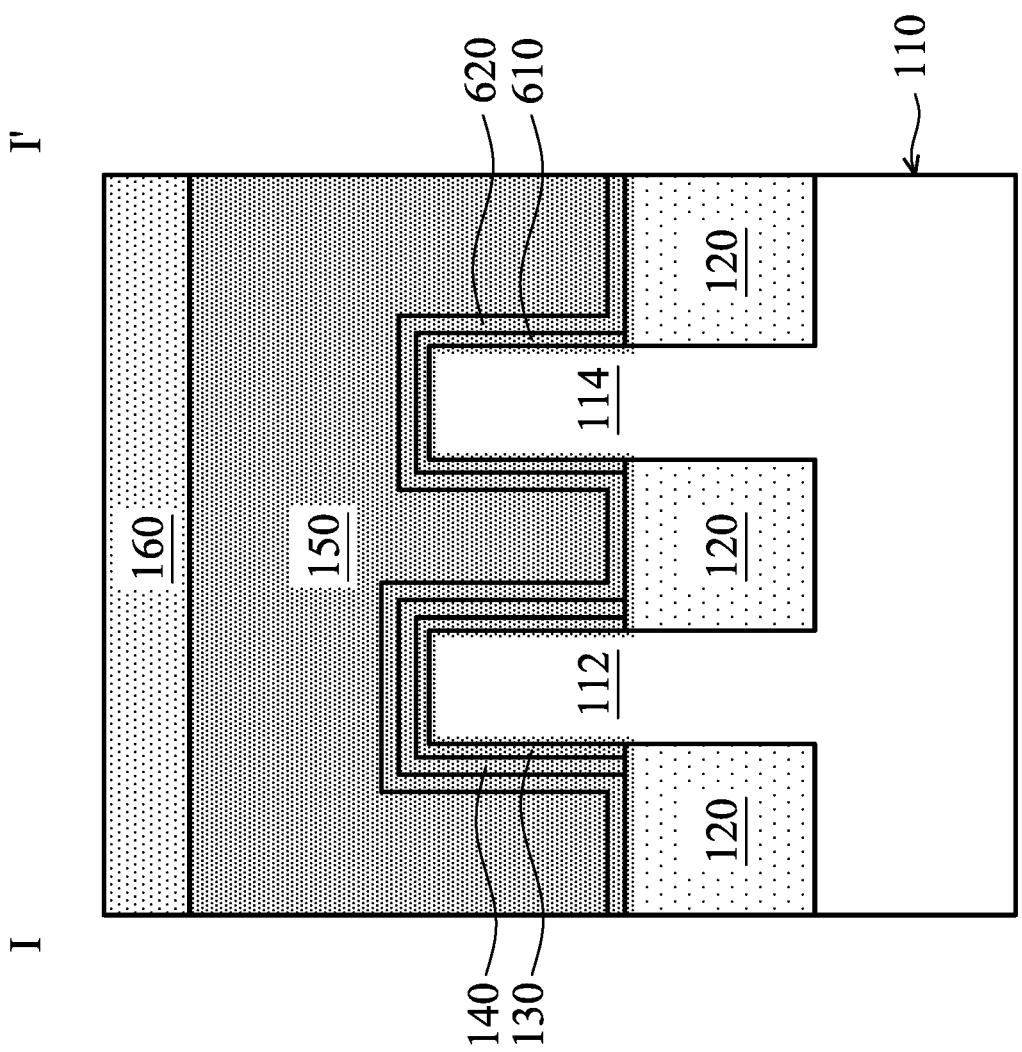
Figures 1, 6E:
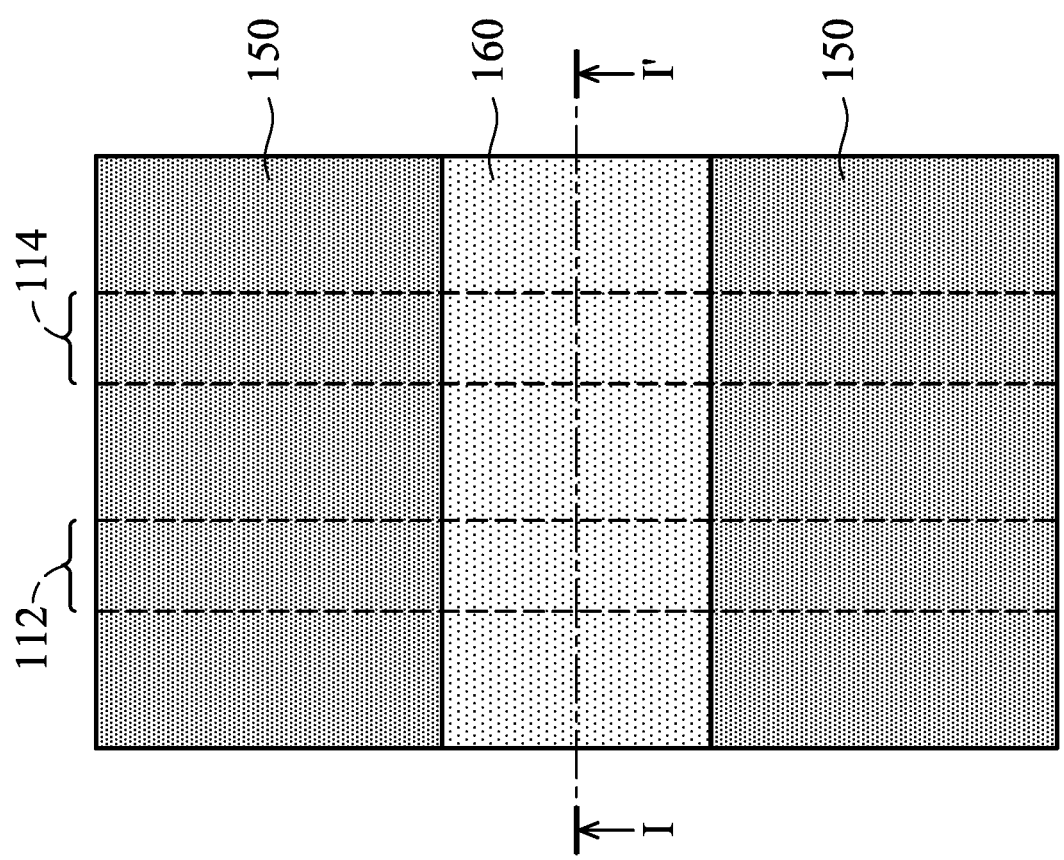

FIG. 6E-1 is a top view of the semiconductor device structure of FIG. 6E, in accordance with some embodiments. FIG. 6E is a cross-sectional view illustrating the semiconductor device structure along a sectional line I-I' in FIG. 6E-1, in accordance with some embodiments. As shown in FIGS. 6E and 6E-1, a mask layer M is formed over the gate electrode layer 150, in accordance with some embodiments. The mask layer M is made of a photoresist material or another suitable material, which is different from the material of the gate electrode layer 150, in accordance with some embodiments.

Figure 6F:
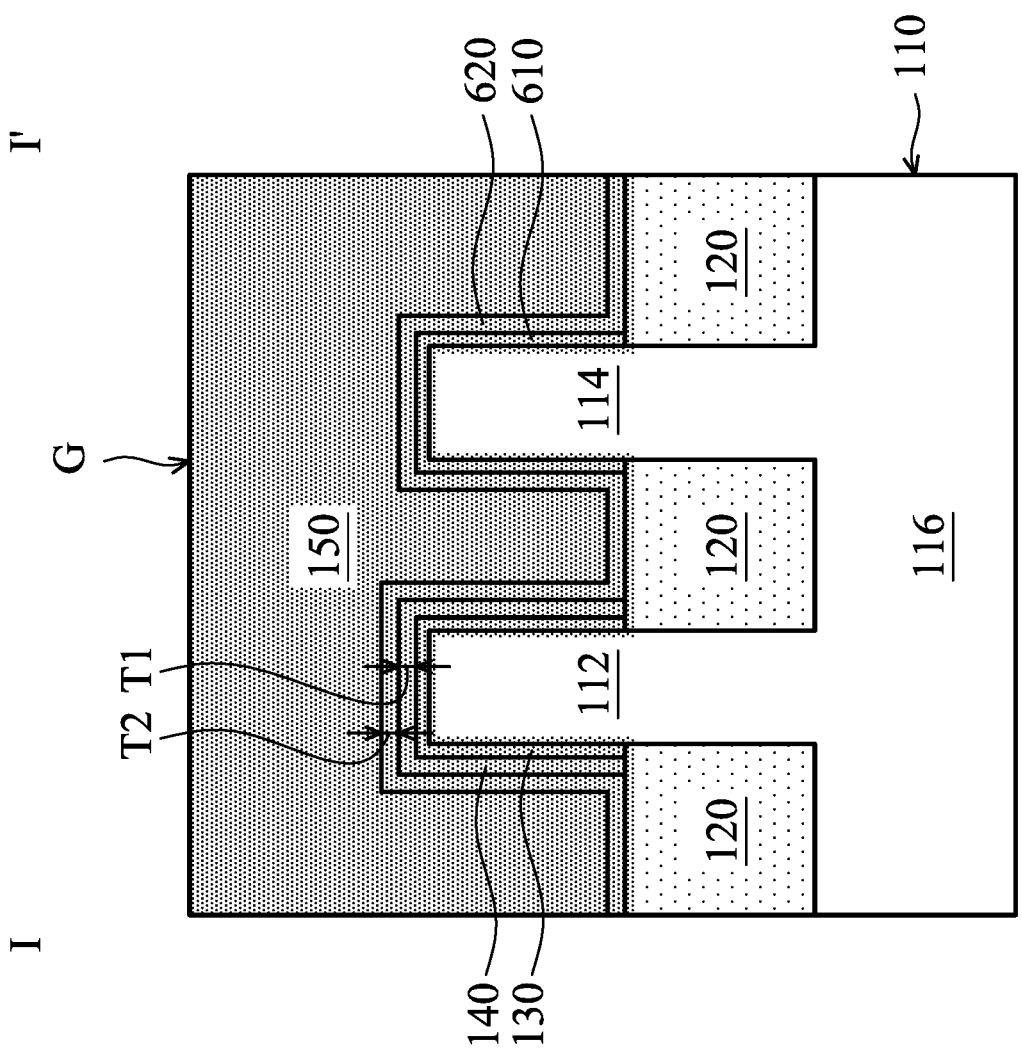
Figures 1, 6F:
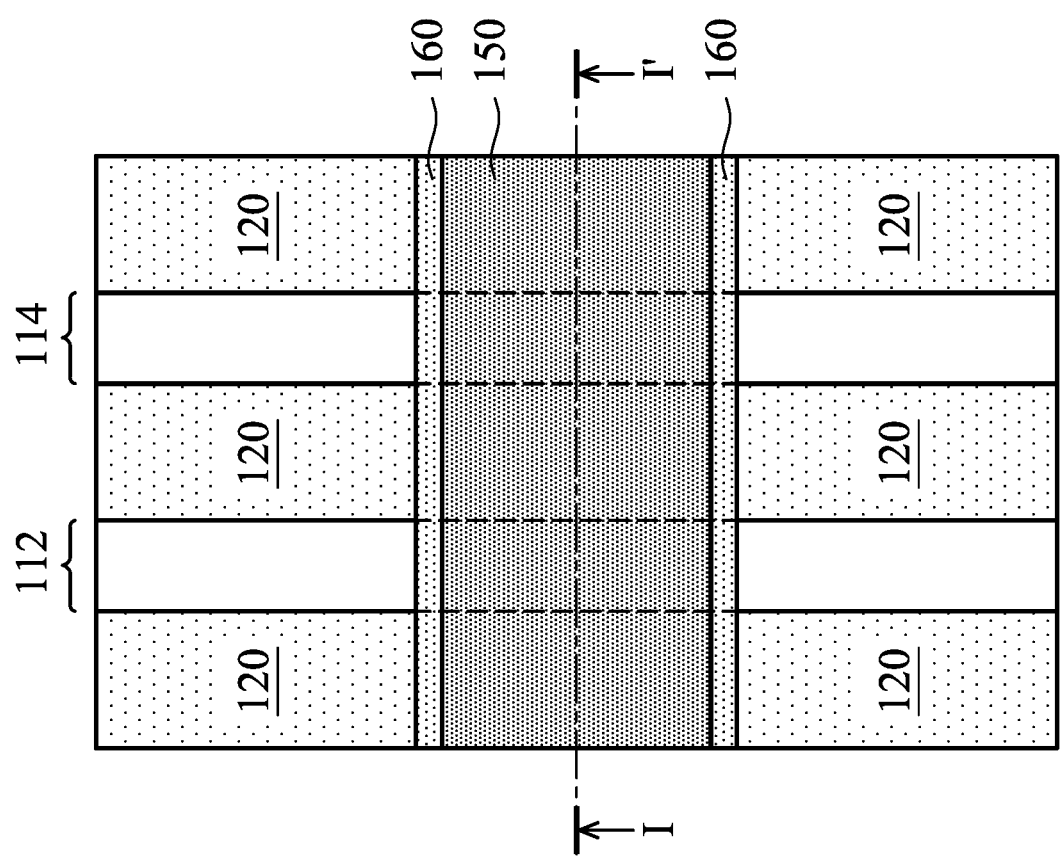
Figures 2, 6F:
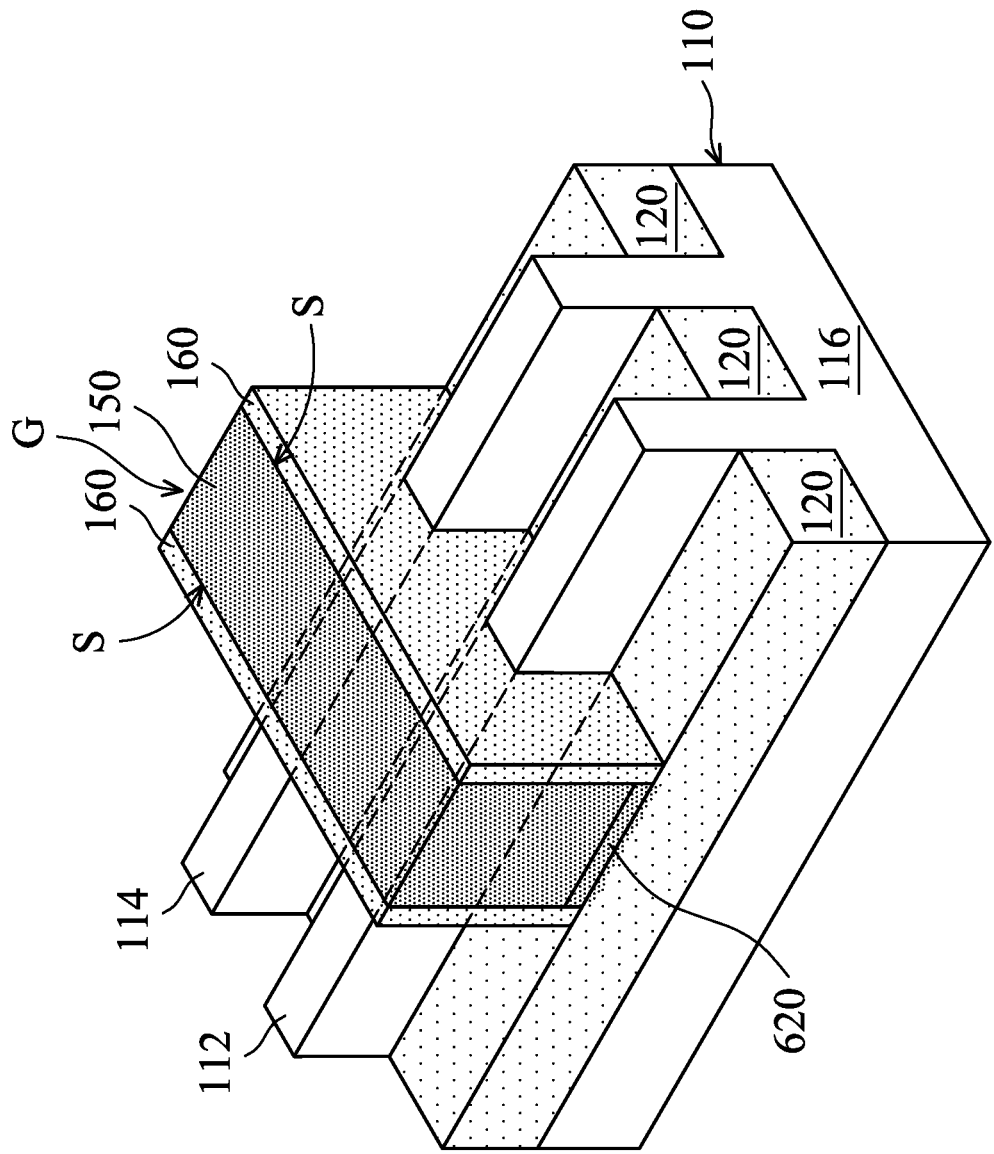

FIG. 6F-1 is a top view of the semiconductor device structure of FIG. 6F, in accordance with some embodiments. FIG. 6F is a cross-sectional view illustrating the semiconductor device structure along a sectional line I-I' in FIG. 6F-1, in accordance with some embodiments. FIG. 6F-2 is a perspective view of the semiconductor device structure of FIG. 6F, in accordance with some embodiments.

As shown in FIGS. 6F, 6F-1, and 6F-2, portions of the gate electrode layer 150, the high-K dielectric layer 620, the interlayer 610, the gate dielectric layer 140, and the semiconductor oxynitride layer 130, which are not under the mask layer M of FIGS. 6E and 6E-1, are removed, in accordance with some embodiments.

After the removal process, the remaining gate electrode layer 150, the remaining high-K dielectric layer 620, the remaining interlayer 610, the remaining gate dielectric layer 140, and the remaining semiconductor oxynitride layer 130 together form a gate stack G, in accordance with some embodiments.

The gate dielectric layer 140 has a thickness T1 ranging from about 10 Å to about 40 Å, in accordance with some embodiments. The high-K dielectric layer 620 has a thickness T2 ranging from about 10 Å to about 40 Å, in accordance with some embodiments. Thereafter, as shown in FIGS. 6F, 6F-1, and 6F-2, the mask layer M is removed, in accordance with some embodiments.

Afterwards, as shown in FIGS. 6F, 6F-1, and 6F-2, a spacer layer 160 is formed over sidewalls S of the gate stack G, in accordance with some embodiments. The spacer layer 160 surrounds the gate stack G, in accordance with some embodiments. The spacer layer 160 is positioned over the fin portions 112 and 114 and the isolation layer 120, in accordance with some embodiments.

The spacer layer 160 includes insulating materials, such as silicon oxide, silicon nitride, silicon oxynitride, or silicon carbide, in accordance with some embodiments. The formation of the spacer layer 160 includes a deposition process and an anisotropic etching process, in accordance with some embodiments.

Figure 7:
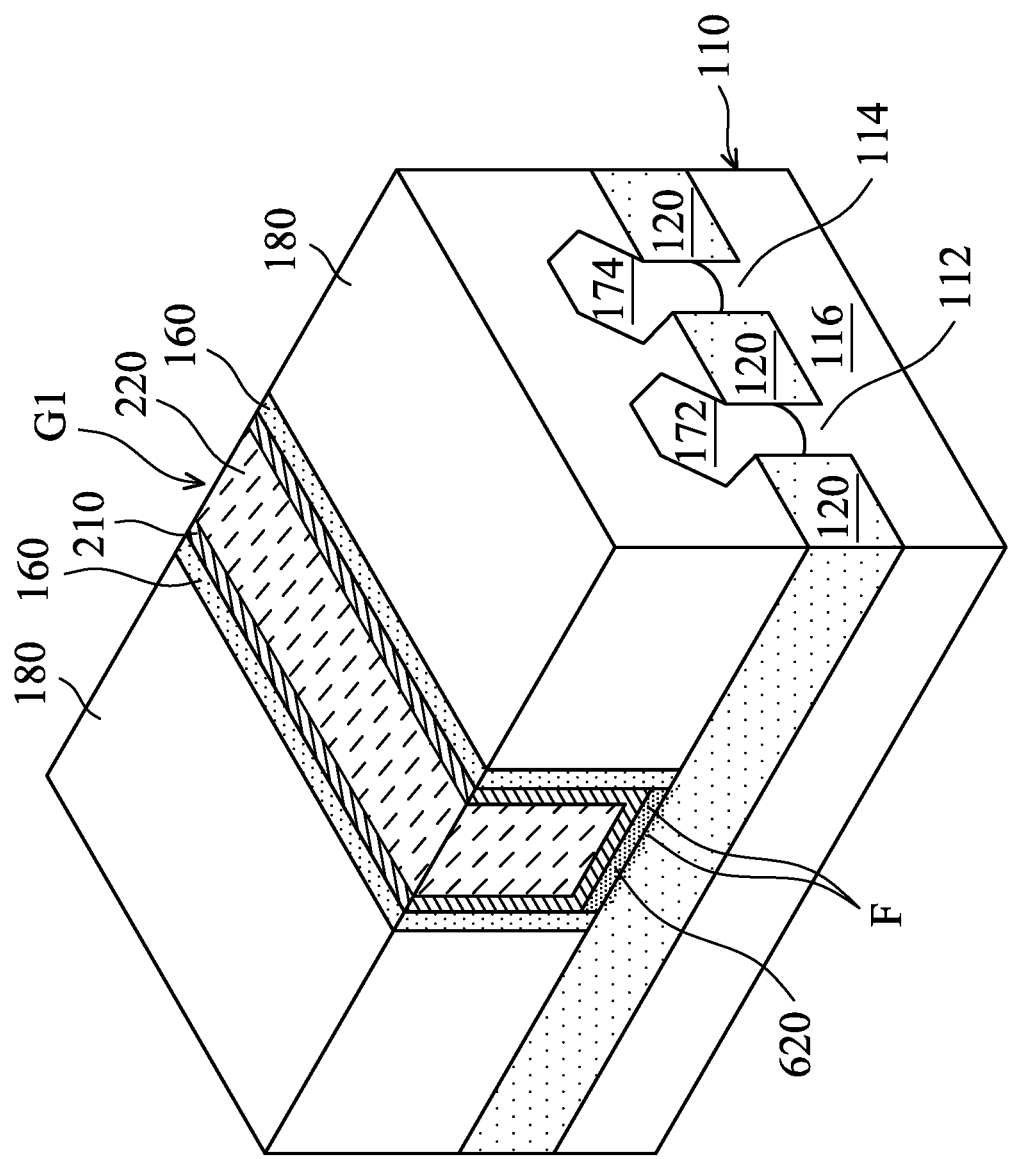
FIG. 7 is a perspective view of a stage of a process for forming a semiconductor device structure, in accordance with some embodiments.

FIG. 7 is a perspective view of a stage of a process for forming a semiconductor device structure, in accordance with some embodiments. As shown in FIG. 7, the steps illustrated in FIGS. 2A-2E are performed, in accordance with some embodiments. As shown in FIG. 7, the insulating layer 180 is formed over the isolation layer 120 and the stressors 172 and 174, in accordance with some embodiments. As shown in FIGS. 7 and 6F, the gate electrode layer 220, the work function metal layer 210, the high-K dielectric layer 620, the interlayer 610, the gate dielectric layer 140, and the semiconductor oxynitride layer 130 together form a gate stack G1, in accordance with some embodiments.

The materials and structures of the insulating layer 180, the work function metal layer 210, and the gate electrode layer 220 are respectively the same as or similar to that of the insulating layer 180, the work function metal layer 210, and the gate electrode layer 220 of FIG. 2E, in accordance with some embodiments.

In accordance with some embodiments, methods for forming semiconductor device structures are provided. The methods (for forming the semiconductor device structure) form a gate dielectric layer over a substrate using a deposition process. Therefore, the formation of the gate dielectric layer does not consume the substrate. The methods form a gate electrode layer, which contains fluorine, over the gate dielectric layer and anneal the gate electrode layer and the gate dielectric layer so that fluorine from the gate electrode layer diffuses into the gate dielectric layer. The fluorine bonds to the dangling bonds of the silicon of the gate dielectric layer. Therefore, the stability, the dielectric property, and the reliability of the gate dielectric layer are improved. The fluorine coming from the gate electrode layer diffuses into the substrate. The fluorine bonds to the dangling bonds of the silicon of the substrate. Therefore, the stability and the reliability of the substrate are improved.

In accordance with some embodiments, a method for forming a semiconductor device structure is provided. The method includes depositing a gate dielectric layer over a substrate. The substrate has a base portion and a first fin portion over the base portion, and the gate dielectric layer is over the first fin portion. The method includes forming a gate electrode layer over the gate dielectric layer. The gate electrode layer includes fluorine. The method includes annealing the gate electrode layer and the gate dielectric layer so that fluorine from the gate electrode layer diffuses into the gate dielectric layer.

In accordance with some embodiments, a method for forming a semiconductor device structure is provided. The method includes depositing an oxide layer over a substrate. The substrate has a base portion and a fin portion over the base portion, and the oxide layer covers the fin portion. The method includes forming a gate electrode layer over the oxide layer. The gate electrode layer includes fluorine. The method includes annealing the gate electrode layer and the oxide layer so that fluorine from the gate electrode layer diffuses into the oxide layer and the fin portion.

In accordance with some embodiments, a method for forming a semiconductor device structure is provided. The method includes forming a gate dielectric layer over a substrate. The substrate has a base portion and a first fin portion over the base portion, and the gate dielectric layer covers the first fin portion. The method includes forming a gate electrode layer over the gate dielectric layer. The gate electrode layer includes fluorine, and the gate electrode layer is in direct contact with the gate dielectric layer. The method includes annealing the gate electrode layer and the gate dielectric layer so that fluorine from the gate electrode layer diffuses into the gate dielectric layer and the first fin portion.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device structure, comprising:
    depositing a gate dielectric layer over a substrate, wherein the substrate has a base portion and a first fin portion over the base portion, and the gate dielectric layer is over the first fin portion;
    forming a gate electrode layer over the gate dielectric layer, wherein the gate electrode layer comprises a semiconductor material and fluorine;
    annealing the gate electrode layer and the gate dielectric layer so that fluorine from the gate electrode layer diffuses into the gate dielectric layer; and
    after annealing the gate electrode layer and the gate dielectric layer, removing a first portion of the gate electrode layer and a second portion of the gate dielectric layer.

2. The method for forming the semiconductor device structure as claimed in claim 1, further comprising:
    forming a semiconductor oxynitride layer over the first fin portion before depositing the gate dielectric layer over the substrate, wherein the gate dielectric layer is formed over the semiconductor oxynitride layer.

3. The method for forming the semiconductor device structure as claimed in claim 2, wherein the semiconductor oxynitride layer is formed using a rapid thermal nitridation treatment.

4. The method for forming the semiconductor device structure as claimed in claim 2, wherein the removing of the first portion of the gate electrode layer and the second portion of the gate dielectric layer further comprises:

removing a third portion of the semiconductor oxynitride layer, wherein the gate electrode layer, the gate dielectric layer, and the semiconductor oxynitride layer remaining over the first fin portion together form a gate stack after removing the first portion of the gate electrode layer, the second portion of the gate dielectric layer, and the third portion of the semiconductor oxynitride layer.

5. The method for forming the semiconductor device structure as claimed in claim 4, further comprising:

forming a spacer layer over a sidewall of the gate stack after removing the first portion of the gate electrode layer, the second portion of the gate dielectric layer, and the third portion of the semiconductor oxynitride layer, wherein the spacer layer wraps around an upper part of the first fin portion.

6. The method for forming the semiconductor device structure as claimed in claim 2, wherein fluorine from the gate electrode layer further diffuses into the semiconductor oxynitride layer through the gate dielectric layer.

7. The method for forming the semiconductor device structure as claimed in claim 6, wherein fluorine from the gate electrode layer further diffuses into the first fin portion through the gate dielectric layer and the semiconductor oxynitride layer.

8. The method for forming the semiconductor device structure as claimed in claim 1, further comprising:

annealing the gate dielectric layer using an annealing gas containing nitrous oxide before forming the gate electrode layer over the gate dielectric layer.

9. The method for forming the semiconductor device structure as claimed in claim 1, wherein the substrate further has a second fin portion over the base portion, the first fin portion and the second fin portion are made of different semiconductor materials, the gate dielectric layer is further formed over the second fin portion, and the gate electrode layer partially over the gate dielectric layer over the second fin portion.

10. The method for forming the semiconductor device structure as claimed in claim 9, wherein the first fin portion is made of silicon and the second fin portion is made of silicon germanium.

11. The method for forming the semiconductor device structure as claimed in claim 1, wherein fluorine from the gate electrode layer further diffuses into the first fin portion during annealing the gate electrode layer and the gate dielectric layer.

12. The method for forming the semiconductor device structure as claimed in claim 1, wherein the substrate further has a second fin portion over the base portion, the gate dielectric layer is further formed over the second fin portion, and the method further comprises:

removing the gate dielectric layer over the second fin portion.

13. The method for forming the semiconductor device structure as claimed in claim 12, further comprising:

forming a high-K dielectric layer over the first fin portion and the second fin portion after removing the gate dielectric layer over the second fin portion, wherein the high-K dielectric layer covers the gate dielectric layer, and the gate electrode layer is formed over the high-K dielectric layer.

14. The method for forming the semiconductor device structure as claimed in claim 13, wherein fluorine from the gate electrode layer further diffuses into the high-K dielectric layer during annealing the gate electrode layer and the gate dielectric layer.

15. A method for forming a semiconductor device structure, comprising:

depositing an oxide layer over a substrate, wherein the substrate has a base portion and a fin portion over the base portion, and the oxide layer covers the fin portion;

forming a gate electrode layer over the oxide layer, wherein the gate electrode layer comprises fluorine;

annealing the gate electrode layer and the oxide layer so that fluorine from the gate electrode layer diffuses into the oxide layer and the fin portion; and after annealing the gate electrode layer and the oxide layer, removing a first portion of the gate electrode layer and a second portion of the oxide layer under the first portion to partially expose the first fin portion.

16. The method for forming the semiconductor device structure as claimed in claim 15, further comprising:

forming an isolation layer over the base portion before depositing the oxide layer over the substrate, wherein the isolation layer surrounds the fin portion, and the oxide layer is further deposited over the isolation layer.

17. The method for forming the semiconductor device structure as claimed in claim 16, wherein fluorine from the gate electrode layer further diffuses into the isolation layer through the oxide layer during annealing the gate electrode layer and the oxide layer.

18. The method for forming the semiconductor device structure as claimed in claim 15, further comprising:

annealing the oxide layer using an annealing gas containing nitrous oxide before forming the gate electrode layer over the oxide layer.

19. The method for forming the semiconductor device structure as claimed in claim 15, further comprising:

forming an insulating layer over the base portion after annealing the gate electrode layer and the oxide layer, wherein the insulating layer surrounds the gate electrode layer and the oxide layer and covers the fin portion;

removing the gate electrode layer to form a trench in the insulating layer, wherein the trench exposes the oxide layer; and forming a metal gate electrode in the trench and over the oxide layer.

20. A method for forming a semiconductor device structure, comprising:

forming a gate dielectric layer over a substrate, wherein the substrate has a base portion and a first fin portion over the base portion, and the gate dielectric layer covers the first fin portion;

forming a gate electrode layer over the gate dielectric layer, wherein the gate electrode layer comprises fluorine, and the gate electrode layer is in direct contact with the gate dielectric layer;

annealing the gate electrode layer and the gate dielectric layer so that fluorine from the gate electrode layer diffuses into the gate dielectric layer and the first fin portion; and after annealing the gate electrode layer and the gate dielectric layer, removing a first portion of the gate electrode layer and a second portion of the gate dielectric layer to expose a first part and a second part of the first fin portion, wherein the gate electrode layer and the gate dielectric layer remain over a third part of the first fin portion, the third part is between the first part and the second part, and the first part, the second part, and the third part all have fluorine from the gate electrode layer.

* * * * *